United States Patent
Yeh et al.

(10) Patent No.: US 10,361,315 B1
(45) Date of Patent: Jul. 23, 2019

(54) METHOD AND APPARATUS OF FABRICATING SOURCE AND DRAIN EPITAXY FOR VERTICAL FIELD EFFECT TRANSISTOR

(71) Applicant: International Business Machines Corporation, Armonk, NY (US)

(72) Inventors: Chun-Chen Yeh, Danbury, CT (US); Kangguo Cheng, Schenectady, NY (US); Ruilong Xie, Schenectady, NY (US); Tenko Yamashita, Schenectady, NY (US); Cheng Chi, Jersey City, NJ (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/928,325

(22) Filed: Mar. 22, 2018

(51) Int. Cl.
  *H01L 29/66* (2006.01)
  *H01L 29/786* (2006.01)
  *H01L 21/8238* (2006.01)

(52) U.S. Cl.
  CPC .... *H01L 29/78642* (2013.01); *H01L 29/6653* (2013.01); *H01L 29/6656* (2013.01); *H01L 29/66545* (2013.01); *H01L 29/66742* (2013.01); *H01L 21/823885* (2013.01)

(58) Field of Classification Search
  CPC ............. H01L 29/401; H01L 29/41741; H01L 29/66666; H01L 29/7827–783
  See application file for complete search history.

(56) References Cited

U.S. PATENT DOCUMENTS

| | | | |
|---|---|---|---|
| 7,074,656 | B2 | 7/2006 | Yeo et al. |
| 7,683,428 | B2 | 3/2010 | Chidambarrao et al. |
| 8,637,849 | B2 | 1/2014 | Deligianni et al. |
| 9,299,835 | B1 | 3/2016 | Anderson et al. |
| 9,431,305 | B1 | 8/2016 | Anderson et al. |
| 9,530,866 | B1 | 12/2016 | Zhang et al. |
| 9,640,636 | B1 | 5/2017 | Bentley et al. |
| 9,735,253 | B1 | 8/2017 | Bi et al. |
| 9,748,380 | B1 | 8/2017 | Lie et al. |
| 10,217,846 | B1 * | 2/2019 | Xie .................. H01L 29/66787 |
| 2017/0222045 | A1 * | 8/2017 | Leobandung ....... H01L 29/0847 |

OTHER PUBLICATIONS

D. Yakimets et al., "Vertical GAAFETs for the ultimate CMOS scaling," IEEE Transactions on Electron Devices, vol. 62, No. 5, 2015, pp. 1433-1439.

* cited by examiner

*Primary Examiner* — Daniel P Shook
(74) *Attorney, Agent, or Firm* — Garg Law Firm, PLLC; Rakesh Garg; Grant Johnson

(57) ABSTRACT

Fabricating a semiconductor device includes receiving a semiconductor structure including a substrate, a fin formed on a portion of the substrate, and a first hard mask disposed on a top surface of the fin. A bottom spacer is formed on the substrate in contact with a bottom portion of the fin. A top spacer is formed in contact with a top portion of the fin. A lateral recess is formed in the substrate under the bottom spacer. A first epitaxy upon the bottom spacer within the lateral recess and a second epitaxy upon the top spacer are simultaneously grown. The first epitaxy forms a bottom source and drain and the second epitaxy forms a top source and drain.

20 Claims, 36 Drawing Sheets

METHOD AND APPARATUS OF FABRICATING SOURCE AND DRAIN EPITAXY FOR VERTICAL FIELD EFFECT TRANSISTOR

TECHNICAL FIELD

The present invention relates generally to a method for fabricating a vertical field effect transistor and an apparatus formed by the method. More particularly, the present invention relates to a method for fabricating source and drain epitaxy for a vertical field effect transistor and an apparatus formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication. A vertical transistor is a non-planar device having a thin vertical silicon "fin" inversion channel on top of the substrate allowing the gate to make a point of contact on the left and right sides of the fin. Source/drains (S/D) are formed on the top and bottom of the vertical fin and the current flows in a direction that is nominal to the substrate as opposed to a lateral flow found in planar semiconductor devices. A Vertical Field Effect Transistor (VFET) is a FET formed as a vertical transistor. Epitaxy refers to the deposition of a semiconductor material upon a surface of a semiconductor material during fabrication of a semiconductor. Epitaxy is often used in fabrication of source/drain regions of a FET. Epitaxial material, such as films or layers, are often grown upon the semiconductor surface from gaseous or liquid precursors in which the semiconductor surface acts as a seed for growth of the epitaxial material.

SUMMARY

The illustrative embodiments provide a method and apparatus. An embodiment of a method for fabricating a semiconductor device includes receiving a semiconductor structure including a substrate. In the embodiment, the substrate structure further includes a fin formed on a portion of the substrate, and a first hard mask disposed on a top surface of the fin. The embodiment further includes forming a bottom spacer on the substrate, the bottom spacer being in contact with a bottom portion of the fin. The embodiment further includes forming a top spacer in contact with a top portion of the fin. The embodiment further includes forming a lateral recess in the substrate under the bottom spacer. The embodiment further includes simultaneously growing a first epitaxy upon the bottom spacer within the lateral recess and a second epitaxy upon the top spacer, the first epitaxy forming a bottom source and drain and the second epitaxy forming a top source and drain.

An embodiment further includes forming a dummy gate upon the bottom spacer, the dummy gate disposed between the bottom spacer and the top spacer. An embodiment further includes forming a sacrificial spacer upon the top spacer and around a portion of the fin, and etching portions of the top spacer, the dummy gate, the bottom spacer, and the substrate to form a trench adjacent to the fin. In an embodiment forming the lateral recess includes removing portions of the substrate within the trench under the bottom spacer. An embodiment further includes removing the sacrificial spacer. In an embodiment, the lateral recess is formed by a lateral etching process.

An embodiment further includes removing the dummy gate, and forming a metal gate between the bottom spacer and the top spacer. In an embodiment, forming the metal gate further includes depositing a metal gate material, and etching the metal gate material such that the metal gate material remains between the bottom spacer and the top spacer. In an embodiment, the metal gate material includes a high dielectric constant (high-K) metal gate material.

An embodiment further includes depositing an interlayer dielectric material upon the semiconductor structure, and forming a contact within the interlayer dielectric material in contact with the top source and drain.

An embodiment further includes depositing an oxide fill upon the bottom spacer, the oxide fill disposed between the bottom spacer and the top spacer. An embodiment further includes depositing a liner upon the top spacer around the top portion of the fin, and forming a top recess within the liner around the top portion of the fin, the second epitaxy growing within the top recess.

An embodiment further includes removing the oxide fill, and forming a forming a metal gate between the bottom spacer and the top spacer.

An embodiment of an apparatus includes a semiconductor structure including a substrate. In the embodiment, the substrate structure further includes a fin formed on a portion of the substrate, and a first hard mask disposed on a top surface of the fin. The embodiment further includes a bottom spacer formed on the substrate, the bottom spacer being in contact with a bottom portion of the fin. The embodiment further includes a top spacer formed in contact with a top portion of the fin. The embodiment further includes a lateral recess formed in the substrate under the bottom spacer. The embodiment further includes a first epitaxy upon the bottom spacer within the lateral recess and a second epitaxy upon the top spacer, the first epitaxy forming a bottom source and drain and the second epitaxy forming a top source and drain, wherein the first epitaxy and the second epitaxy are grown simultaneously.

An embodiment further includes a trench formed adjacent to the fin through portions of the top spacer, the bottom spacer, and the substrate. An embodiment further includes a metal gate between the bottom spacer and the top spacer. An embodiment further includes an interlayer dielectric material deposited upon the semiconductor structure, and a contact formed within the interlayer dielectric material in contact with the top source and drain.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
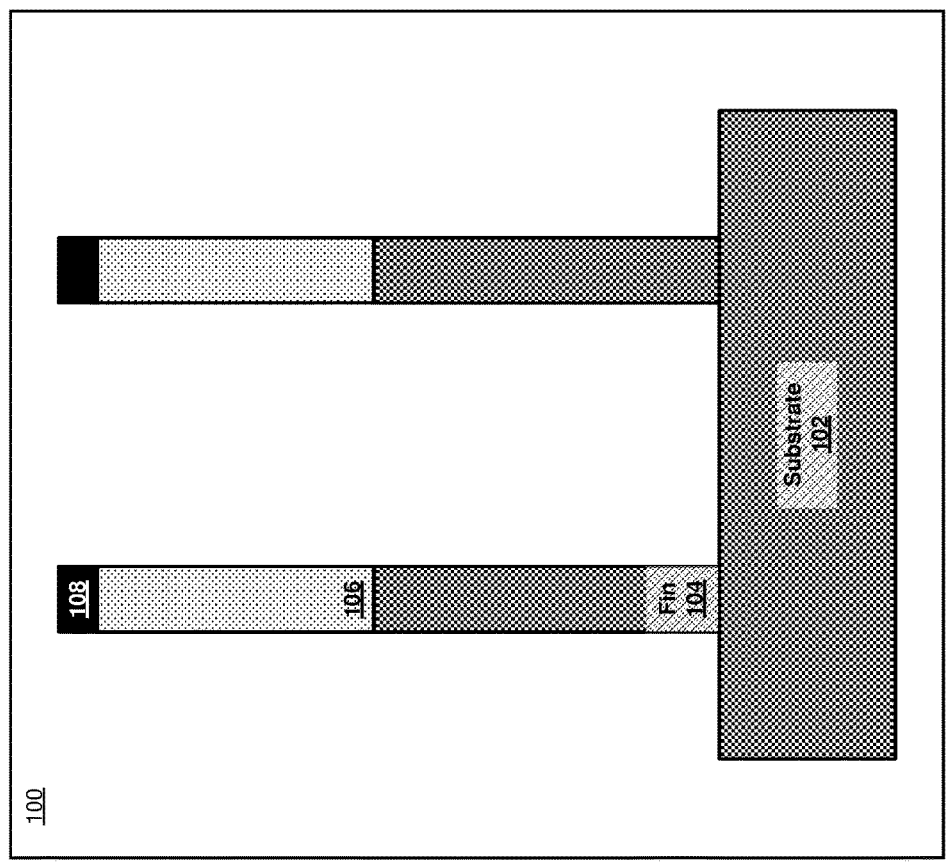
FIG. 1, depicts a portion of a process for fabricating a VFET according to an illustrative embodiment.

One or more embodiments of the present invention are directed to a process for fabricating source and drain epitaxy for a vertical transistor and an apparatus formed by the process. The VFET structure has a vertical channel carrier flow to enable pitch scaling. As a result, the source and drain junction is separated from the channel. Due to the topography of the VFET structure, it is difficult to form the source and drain simultaneously. Conventional processes for fabrication of VFETs, such as complementary metal-oxide-semiconductor (CMOS) VFETs, form the top and bottom source and drain doped epitaxy during different stages of fabrication and typically require the use of four masks and four epitaxy processes to form the top and bottom source and drain epitaxy. The use of multiple steps for formation of the source and drain epitaxy greatly increases the cost of fabrication.

The illustrative embodiments used to describe the invention generally address and solve the above-described problems and other problems related to fabricating source and drain epitaxy for vertical transistors. One or more embodiments described herein provide for a fabrication of top and bottom source and drain doped epitaxy for vertical transistors, such as VFETs, in a single step. One or more embodiments described herein may provide one or more of the advantages of reduced expense, improved process control and reduction of potential variability issues in fabricating vertical transistors.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate vertical transistors and high-voltage varactors on the same substrate.

For the clarity of the description, and without implying any limitation thereto, the illustrative embodiments are described using a particular VFET structure having a particular number of fins and gates. An embodiment can be implemented with a different number of gates, different number of fins, or both, within the scope of the illustrative embodiments.

Furthermore, a simplified diagram of the example vertical transistors are used in the figures and the illustrative embodiments. In an actual fabrication of a vertical transistor, additional structures that are not shown or described herein may be present without departing the scope of the illustrative embodiments. Similarly, within the scope of the illustrative embodiments, a shown or described structure in the example vertical transistors may be fabricated differently to yield a similar operation or result as described herein.

Differently shaded portions in the two-dimensional drawing of the example vertical transistors are intended to represent different structures in the example vertical transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a vertical transistor and a high-voltage varactor according to the illustrative embodiments.

Furthermore, the illustrative embodiments are described with respect to a vertical transistor only as an example. The steps described by the various illustrative embodiments can be adapted for fabricating other planar and non-planar devices employing vertical transport in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a manufacturing device, tool, or data processing system, comprises substantial advancement of the functionality of that manufacturing device, tool, or data processing system in fabricating VFET devices.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

With reference to FIG. 1, this figure depicts a portion of a process for fabricating a VFET according to an illustrative embodiment. In the illustrative embodiment, a semiconductor structure 100 including a substrate 102 having two vertical fins 104, a first hardmask 106 disposed on each fin 104, and a second hardmask 108 disposed on each first hardmask 106 is received. In one or more embodiments, the material of first hardmask 106 has a lower dielectric constant than that of substrate 102. For clarity of illustration, the portions of the process of fabrication shown in FIGS. 1-6 are illustrated with respect to a single transistor region having two fins 104 in which the portion of the process is the same for both n-type FET (NFET) region fabrication and p-type (PFET) region fabrication as will be further described herein. In one or more embodiments, second hardmask 108 improves etch selectivity during subsequent stages of the fabrication process. In a particular embodiment, substrate 102 and fin 104 are formed of a silicon (Si) material. In another particular embodiment, first hard mask 106 is formed of a silicoboron carbonitride (SiBCN) material. In another particular embodiment, second hardmask 108 is formed of a hafnium oxide (HfO$_2$) material.

Figure 2:
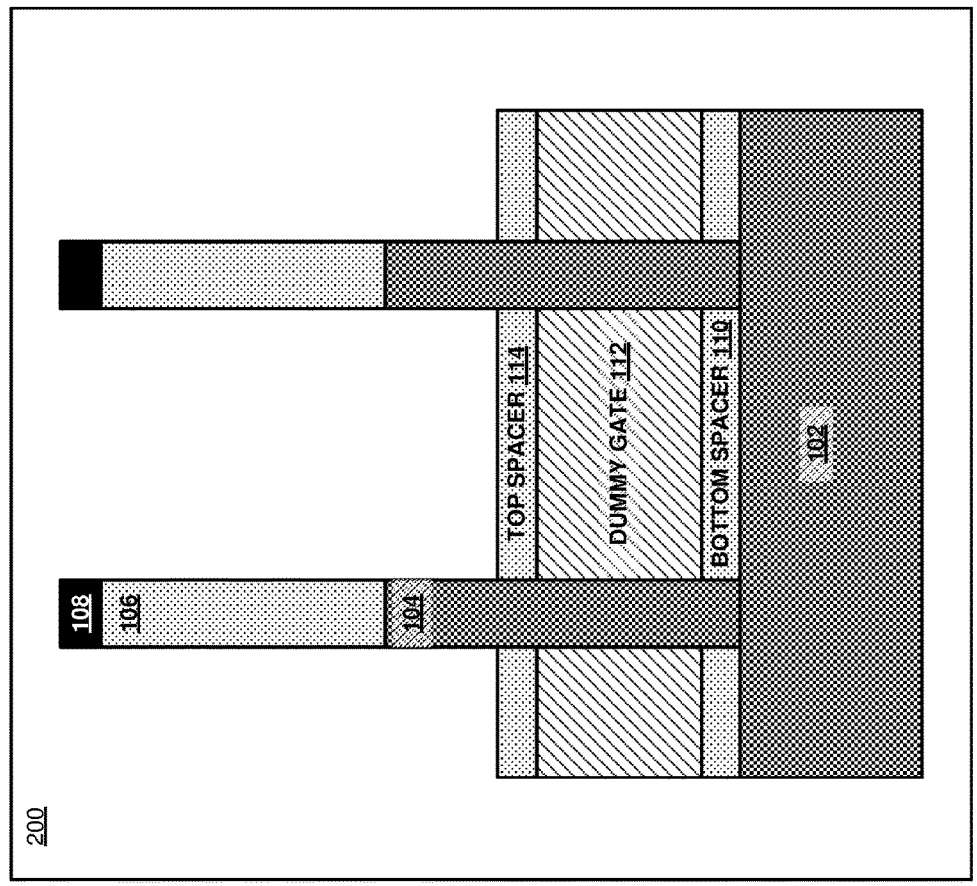
FIG. 2 depicts another portion of the process in which a structure 200 is formed.

With reference to FIG. 2, this figure depicts another portion of the process in which a structure 200 is formed. In the embodiment, a fabrication system forms a bottom spacer 110 upon an upper surface of substrate 102 in contact with a bottom portion of fins 104. In the embodiment, the fabrication system forms a dummy gate 112 upon an upper surface of bottom spacer 110. In the embodiment, the fabrication system forms a top spacer 114 upon dummy gate 112 in contact with a top portion of fins 104. In a particular embodiment, bottom spacer 110 and top spacer 114 are formed of a SiBCN material. In another particular embodiment, dummy gate 112 is formed of a silicon dioxide (SiO$_2$) material.

Figure 3:
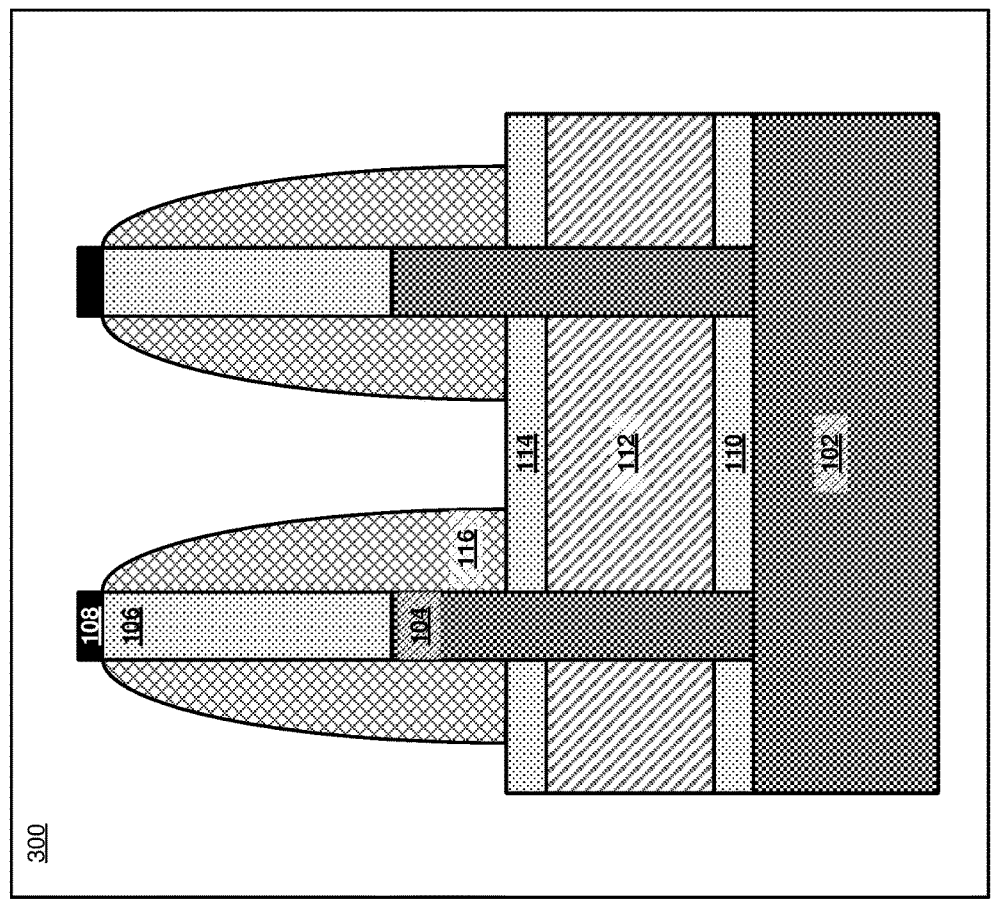
FIG. 3 depicts another portion of the process in which a structure 300 is formed.

With reference to FIG. 3, this figure depicts another portion of the process in which a structure 300 is formed. In the embodiment, the fabrication system forms sacrificial spacers 116 upon a top surface of top spacer 114 and around portions of fins 104 and first hardmasks 106. In one or more embodiments, sacrificial spacers 116 are of a domed shape that tapers toward an upper portion of first hardmask 106. In one or more embodiments, the fabrication system forms sacrificial spacers 116 by a deposition process. In a particular embodiment, sacrificial spacers 116 are formed of a titanium oxide (TiOx) material.

Figure 4:
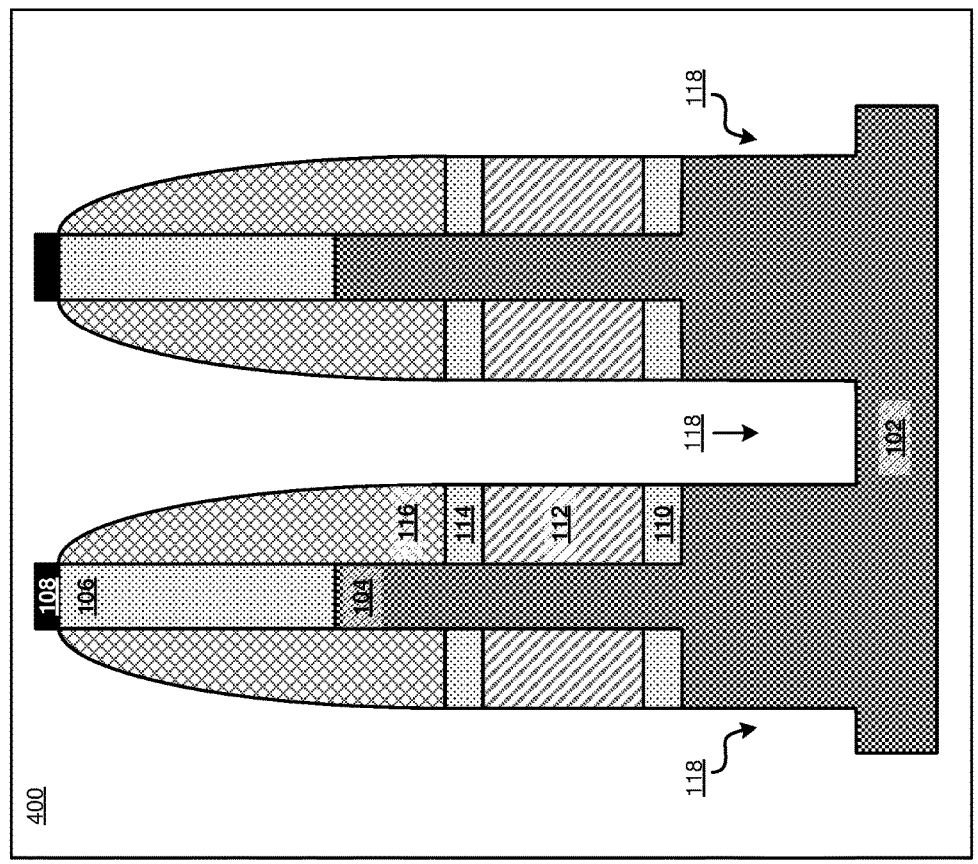
FIG. 4 depicts another portion of the process in which a structure 400 is formed.

With reference to FIG. 4, this figure depicts another portion of the process in which a structure 400 is formed. In the embodiment, the fabrication system etches portions of top spacer 114, dummy gate 112, bottom spacer 110, and substrate 102 to form trenches 118 adjacent to fins 104. In one or more embodiments, the fabrication system etches substrate 102 to below the upper surface of substrate 102. In one or more embodiments, the fabrication system etches the portions of top spacer 114, dummy gate 112, bottom spacer 110, and substrate 102 using a self-aligned PC RIE reactive-ion etching (RIE) process.

Figure 5:
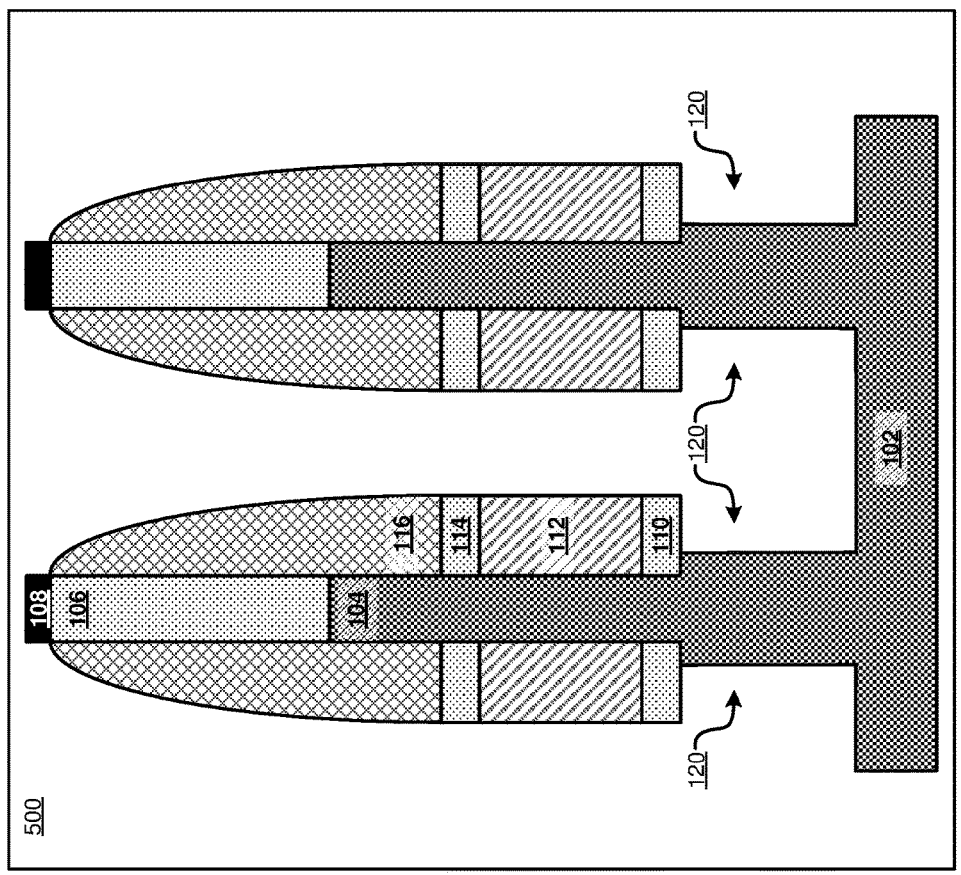
FIG. 5 depicts another portion of the process in which a structure 500 is formed.

With reference to FIG. 5, this figure depicts another portion of the process in which a structure 500 is formed. In the embodiment, the fabrication system trims portions of substrate 102 to form lateral recesses 120 under bottom spacer 110. In a particular embodiment, the fabrication system trims portions of substrate 102 using a lateral etching process such as a non-isotropic etching process.

Figure 6:
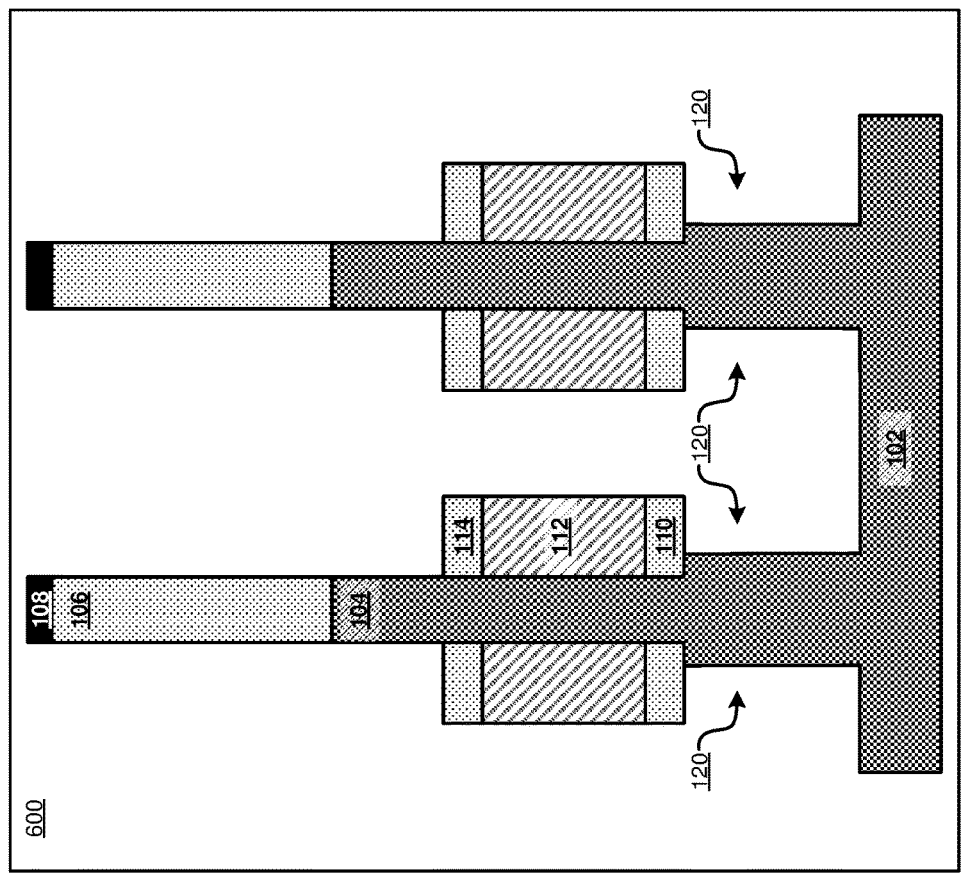
FIG. 6 depicts another portion of the process in which a structure 600 is formed.

With reference to FIG. 6, this figure depicts another portion of the process in which a structure 600 is formed. In the embodiment, the fabrication system removes sacrificial spacers 116. In one or more embodiments, the fabrication system removes sacrificial spacers 116 using a wet solution such as a Standard Clean 1 (SC-1) process.

Figure 7:
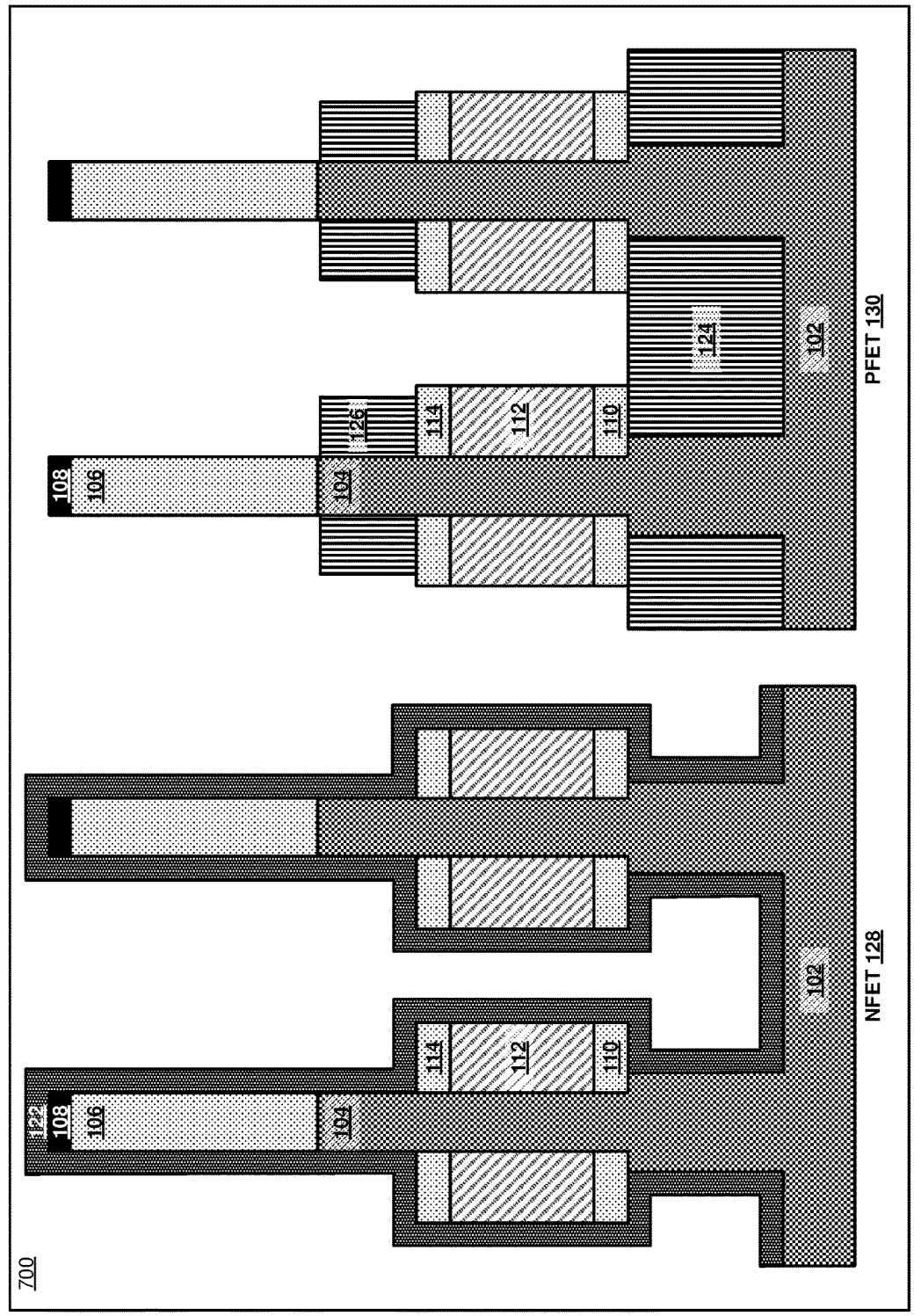
FIG. 7 depicts another portion of the process in which a structure 700 is formed.

With reference to FIG. 7, this figure depicts another portion of the process in which a structure 700 is formed. In the embodiment of FIG. 7, structure 700 includes an NFET region 128 and a PFET region 130 of substrate 102. In one or more embodiments, substrate 102, fins 104, first hardmask 106, second hardmask 108, bottom spacer 110, dummy gate 112, top spacer 114, and lateral recesses 120 of each of NFET region 128 and PFET region 130 are formed by the processes described with respect to FIG. 1-6. In the embodiment, the fabrication system deposits a first liner 122 upon substrate 102, fins 104, first hardmask 106, second hardmask 108, bottom spacer 110, dummy gate 112, top spacer 114, and lateral recesses 120 of NFET region 128. In a particular embodiment, first liner 122 is formed of a silicon nitride (SiN) liner material. In another particular embodiment, first liner 122 is formed of an atomic layer deposition (ALD) TiOx material.

In the embodiment, the fabrication system further performs TJ patterning and deposits an epitaxial growth material upon PFET region 130 to simultaneously grow a first bottom source and drain epitaxy 124 upon substrate 102 within lateral recesses 120 and adjacent to fins 104, and a first top source and drain epitaxy 126 upon top spacer 114 adjacent to fin 104. In the embodiment, first bottom source and drain epitaxy 124 and first top source and drain epitaxy 126 are an nFET epitaxial growth. In the embodiment, first liner 122 prevents growth of the epitaxy material upon portions of NFET region 128. In the embodiment, first bottom source and drain epitaxy 124 grows on the surface of substrate 102 at a faster rate than the first top source and drain epitaxy 126 due to the different material composition of substrate 102 and first top spacer 114. As a result, the volume of epitaxy material grown to form first bottom source and drain epitaxy 124 is greater than that to form first top source and drain epitaxy 126. In one or more embodiments, masking and epitaxy process costs may be reduced.

Figure 8:
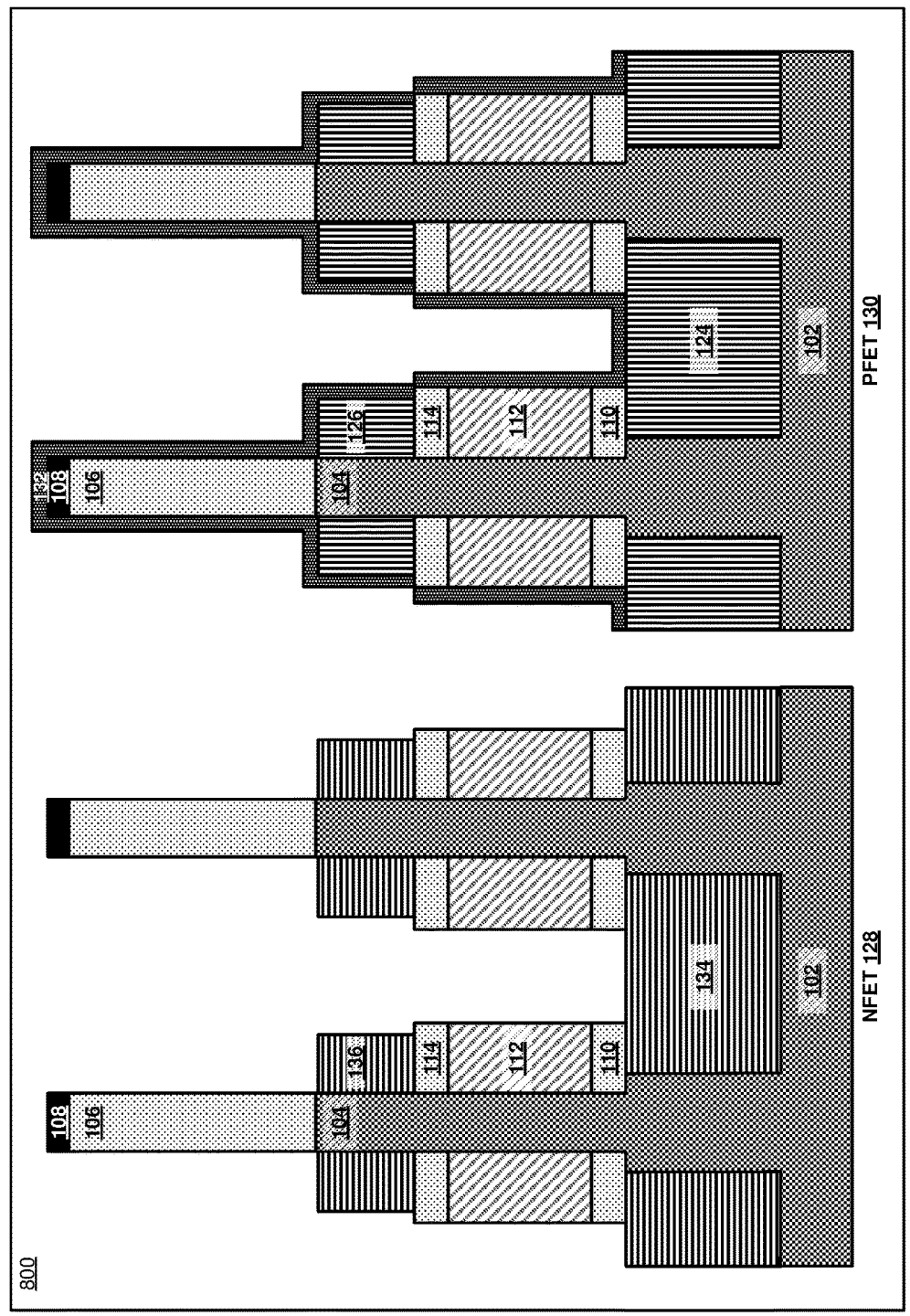
FIG. 8 depicts another portion of the process in which a structure 800 is formed.

With reference to FIG. 8, this figure depicts another portion of the process in which a structure 800 is formed. In the embodiment, the fabrication system removes first liner 122 from NFET region 128 and deposits a second liner 122 upon substrate 102, fins 104, first hardmask 106, second hardmask 108, bottom spacer 110, dummy gate 112, top spacer 114, first source and drain bottom epitaxy 124, and first source and drain top epitaxy 126 of PFET region 130. In a particular embodiment, second liner 132 is formed of a silicon nitride (SiN) liner material. In another particular embodiment, second liner 132 is formed of an atomic layer deposition (ALD) TiOx material.

In the embodiment, the fabrication system further performs RG patterning and deposits an epitaxial growth material upon NFET region 130 to simultaneously grow a second bottom source and drain epitaxy 134 upon substrate 102 within lateral recesses 120 and adjacent to fins 104, and a second top source and drain epitaxy 136 upon top spacer 114 adjacent to fin 104. In the embodiment, second bottom source and drain epitaxy 134 and second top source and drain epitaxy 136 are a pFET epitaxial growth. In the embodiment, second liner 132 prevents growth of the epitaxy material upon portions of PFET region 130. In the embodiment, second bottom source and drain epitaxy 134 grows on the surface of substrate 102 at a faster rate than the second top source and drain epitaxy 136 due to the different material composition of substrate 102 and first top spacer 114. As a result, the volume of epitaxy material grown to form second bottom source and drain epitaxy 124 is greater than that to form second top source and drain epitaxy 126. In one or more embodiments, masking and epitaxy process costs may be reduced.

Figure 9:
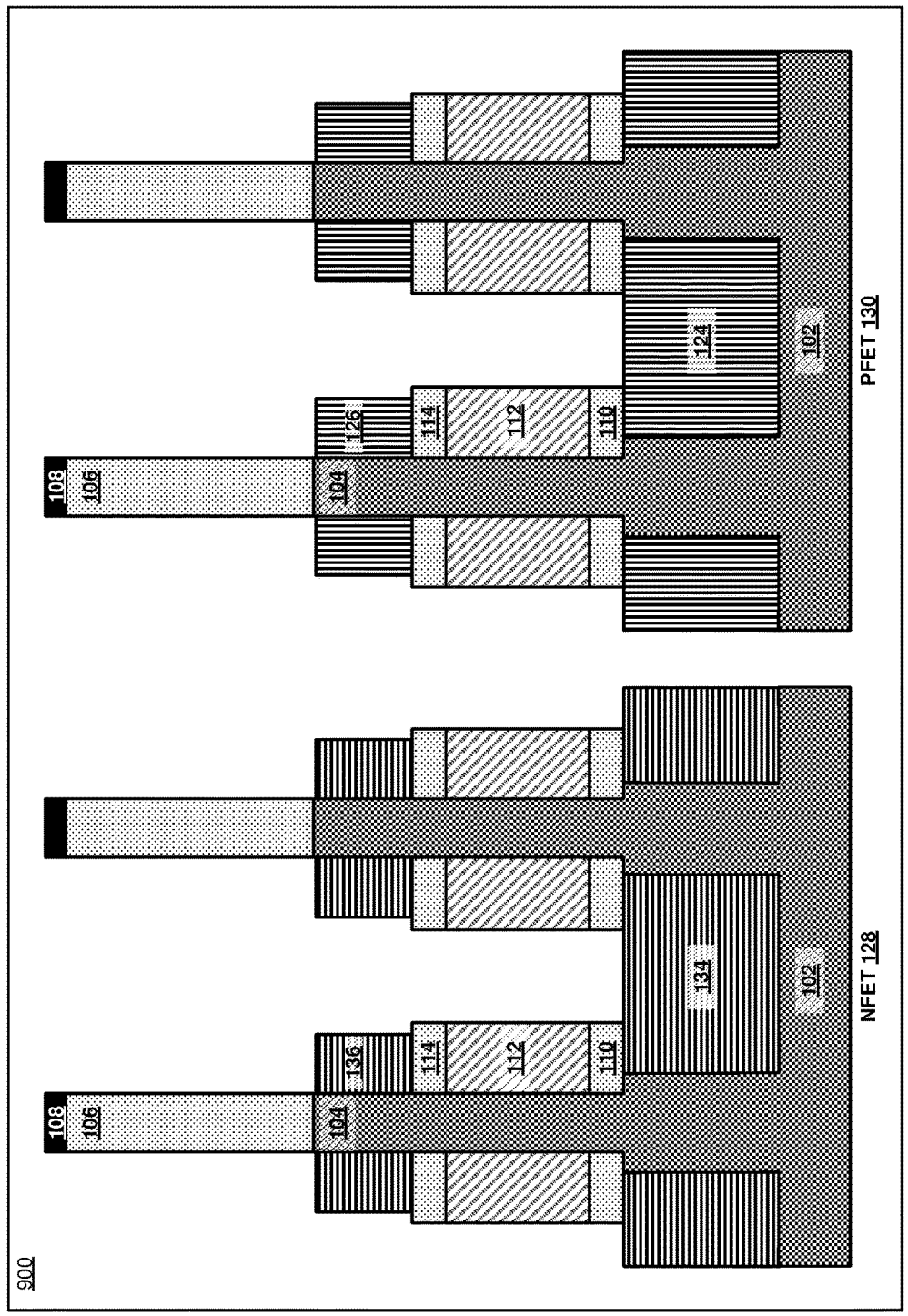
FIG. 9 depicts another portion of the process in which a structure 900 is formed.

With reference to FIG. 9, this figure depicts another portion of the process in which a structure 900 is formed. In the embodiment, the fabrication system removes second liner 132 from PFET region 130.

Figure 10:
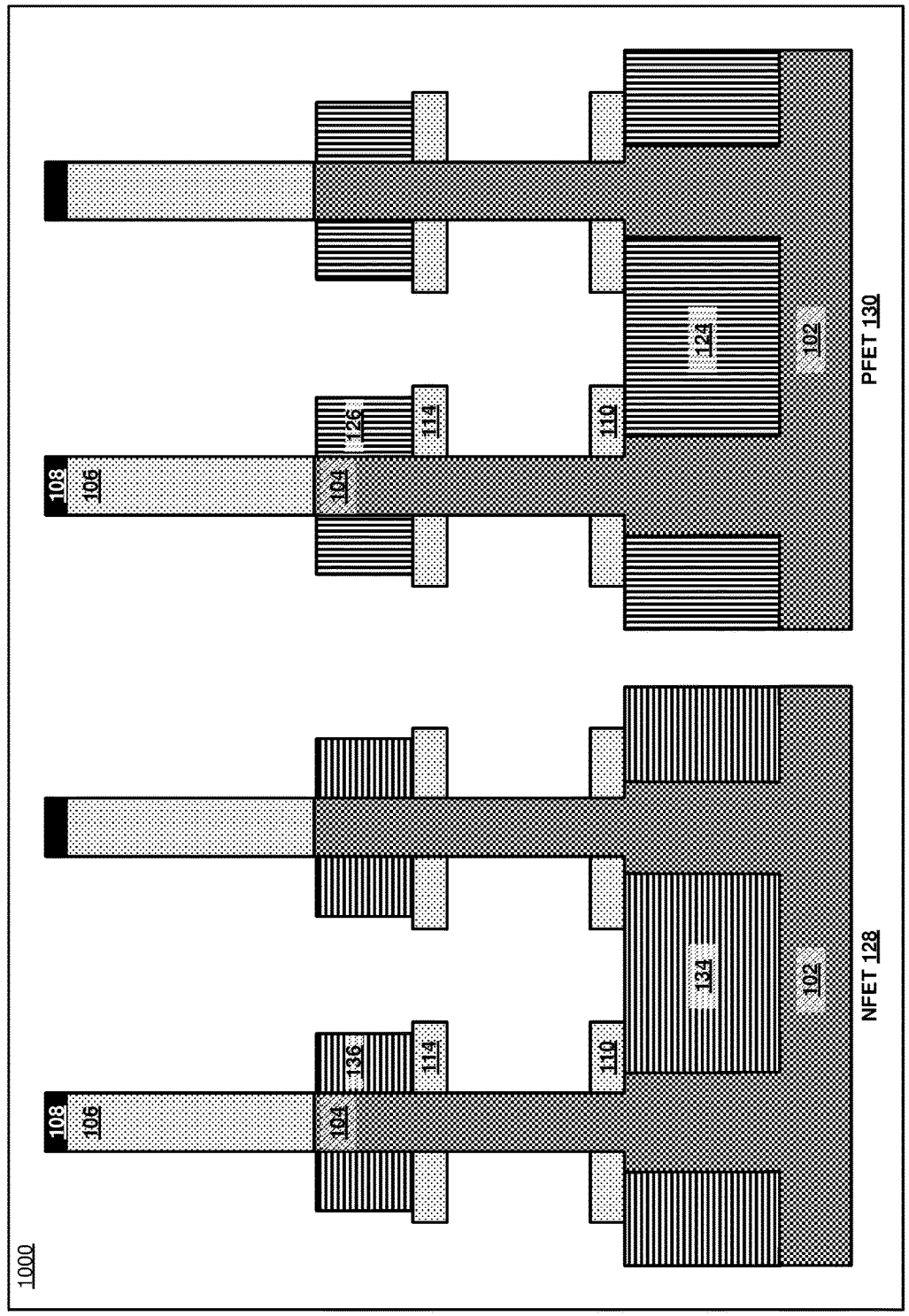
FIG. 10 depicts another portion of the process in which a structure 1000 is formed.

With reference to FIG. 10, this figure depicts another portion of the process in which a structure 1000 is formed. In the embodiment, the fabrication system removes dummy gate from NFET region 128 and PFET region 130.

Figure 11:
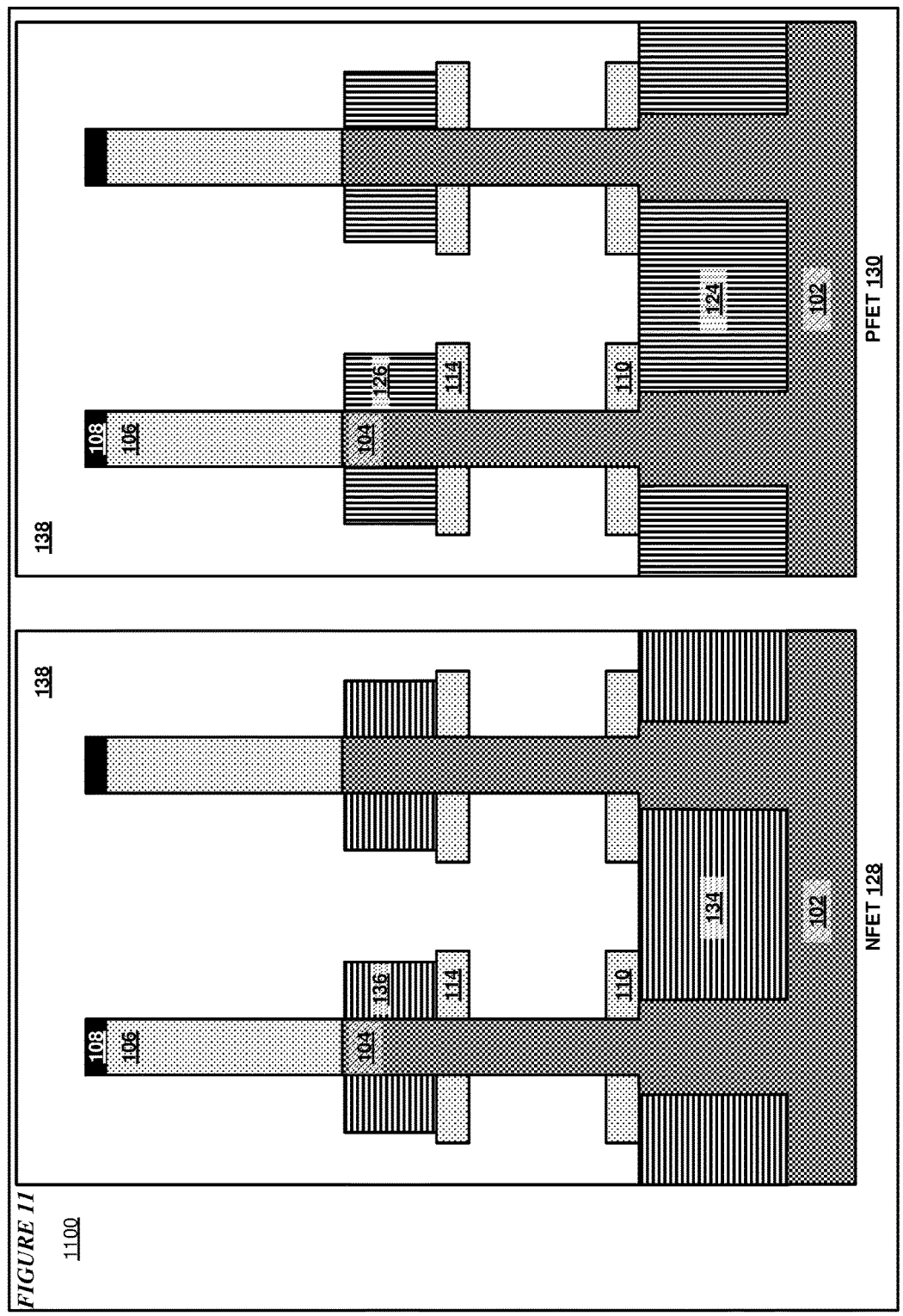
FIG. 11 depicts another portion of the process in which a structure 1100 is formed.

With reference to FIG. 11, this figure depicts another portion of the process in which a structure 1100 is formed. In the embodiment, the fabrication system deposits a metal gate material 138 upon NFET region 128 and PFET region 130. In a particular embodiment, metal gate material 138 includes a high dielectric constant (high K) metal gate material.

Figure 12:
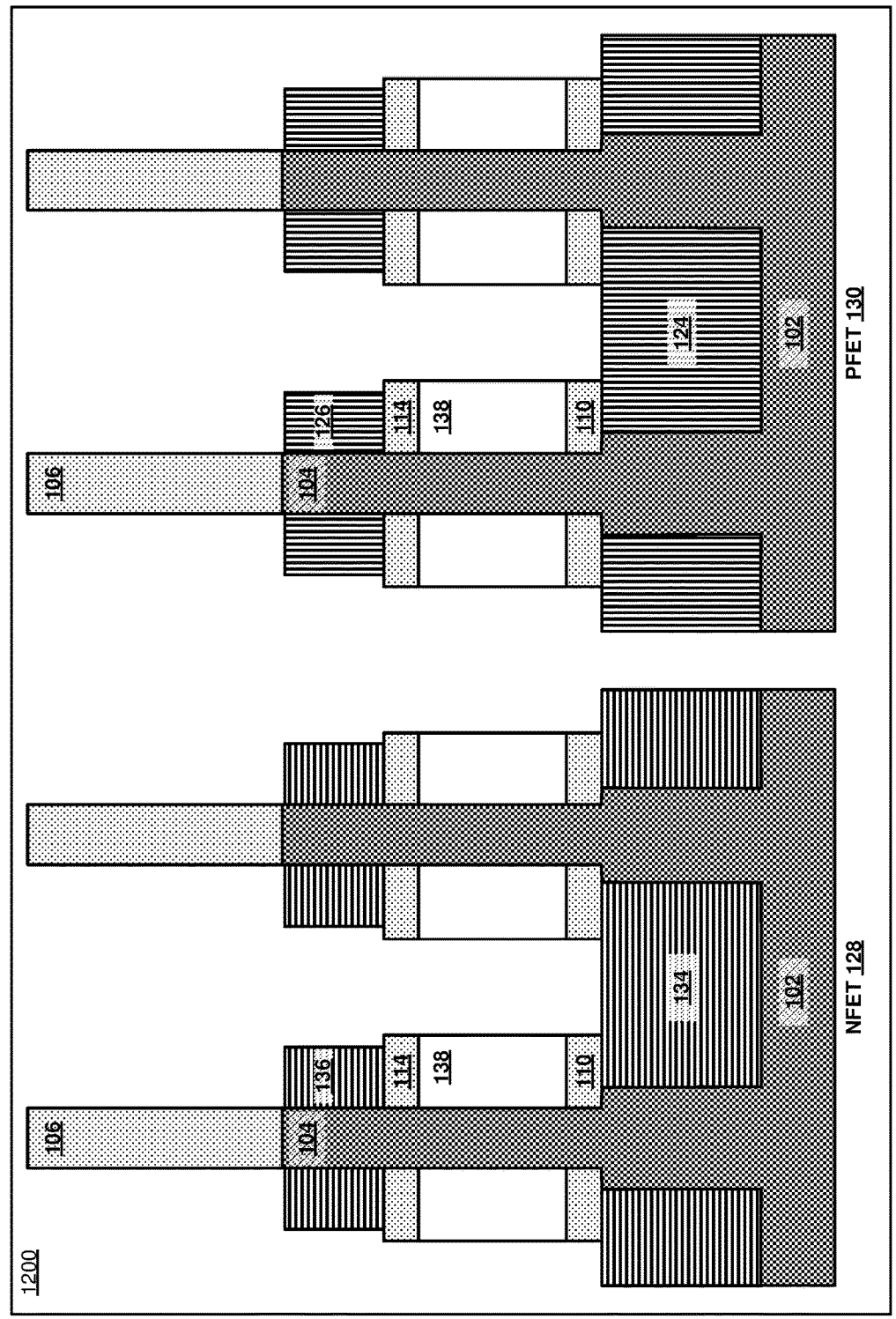
FIG. 12 depicts another portion of the process in which a structure 1200 is formed.

With reference to FIG. 12, this figure depicts another portion of the process in which a structure 1300 is formed. In the embodiment, the fabrication system etches back metal gate material 138 within NFET region 128 and PFET region 130 to substantially remove metal gate material 138 except for portions of metal gate material 138 disposed between bottom spacer 110 and top spacer 114. In particular embodiments, the fabrication system etches metal gate material 138 using a selective etching process such that the material of bottom spacer 110, top spacer 114, first bottom source and drain epitaxy 124, first top source and drain epitaxy 126, second bottom source and drain epitaxy 134, and second top source and drain epitaxy 136 is not affected by the etching process. In a particular embodiment, the selective etching process does not affect SiBCN material and epitaxy material.

Figure 13:
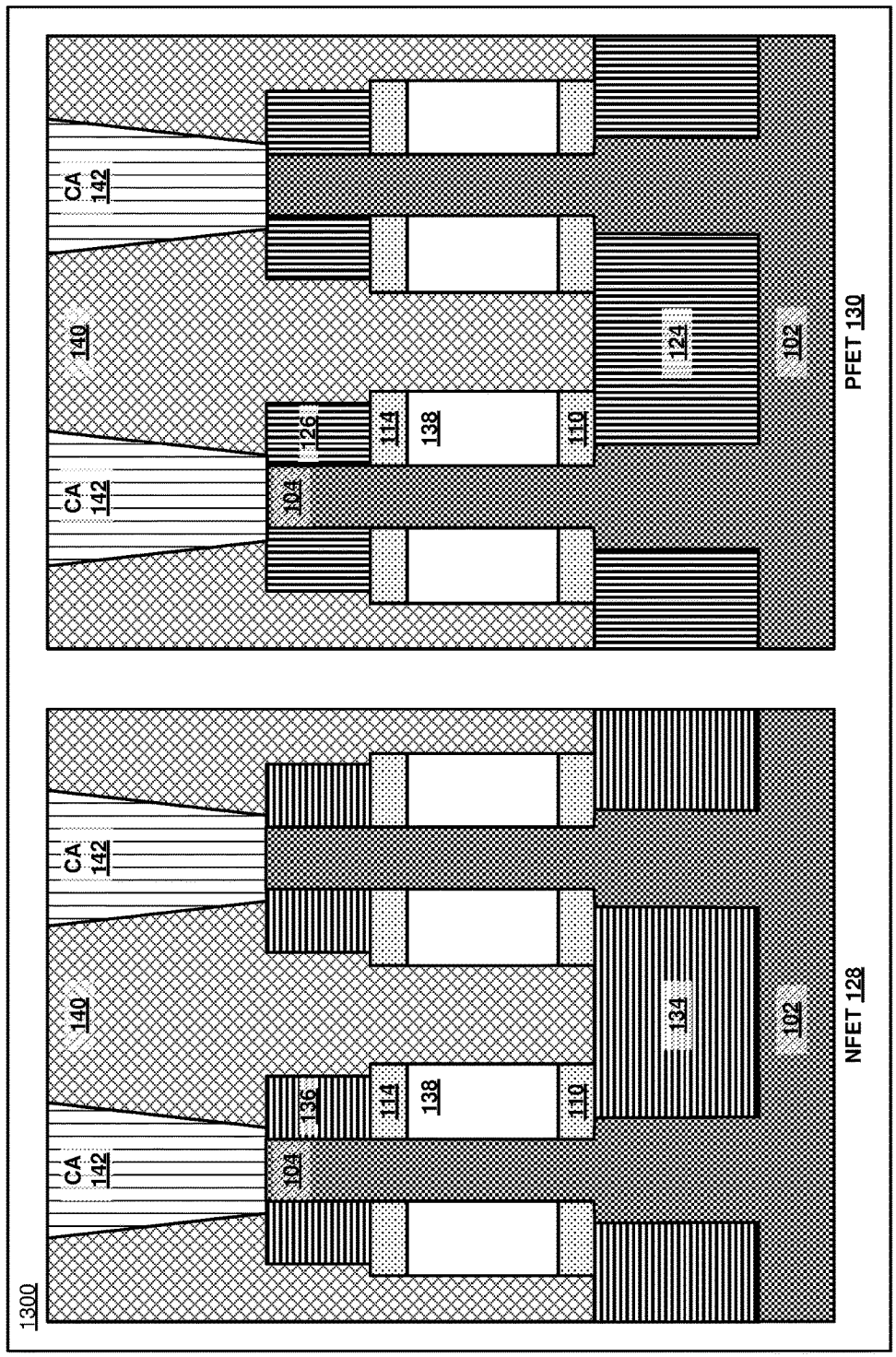
FIG. 13 depicts another portion of the process in which a structure 1300 is formed.

With reference to FIG. 13, this figure depicts another portion of the process in which a structure 1300 is formed. In the embodiment, the fabrication system deposits an interlayer dielectric (ILD) material 140 upon NFET region 128 and PFET region 130. In the embodiment, the fabrication system further forms source and drain contacts (CA) 142 within ILD material 140 in contact with fin 104 and first top source and drain epitaxy 126 in NFET region 128, and fin 104 and second top source and drain epitaxy 136 in PFET region 130. Although not shown in FIG. 13, in an embodiment the fabrication system may further form gate contacts (CB) and trench contacts (TS) within ILD material 140. As a result of the process of FIG. 13, a VFET is fabricated in accordance with an embodiment.

Figure 14:
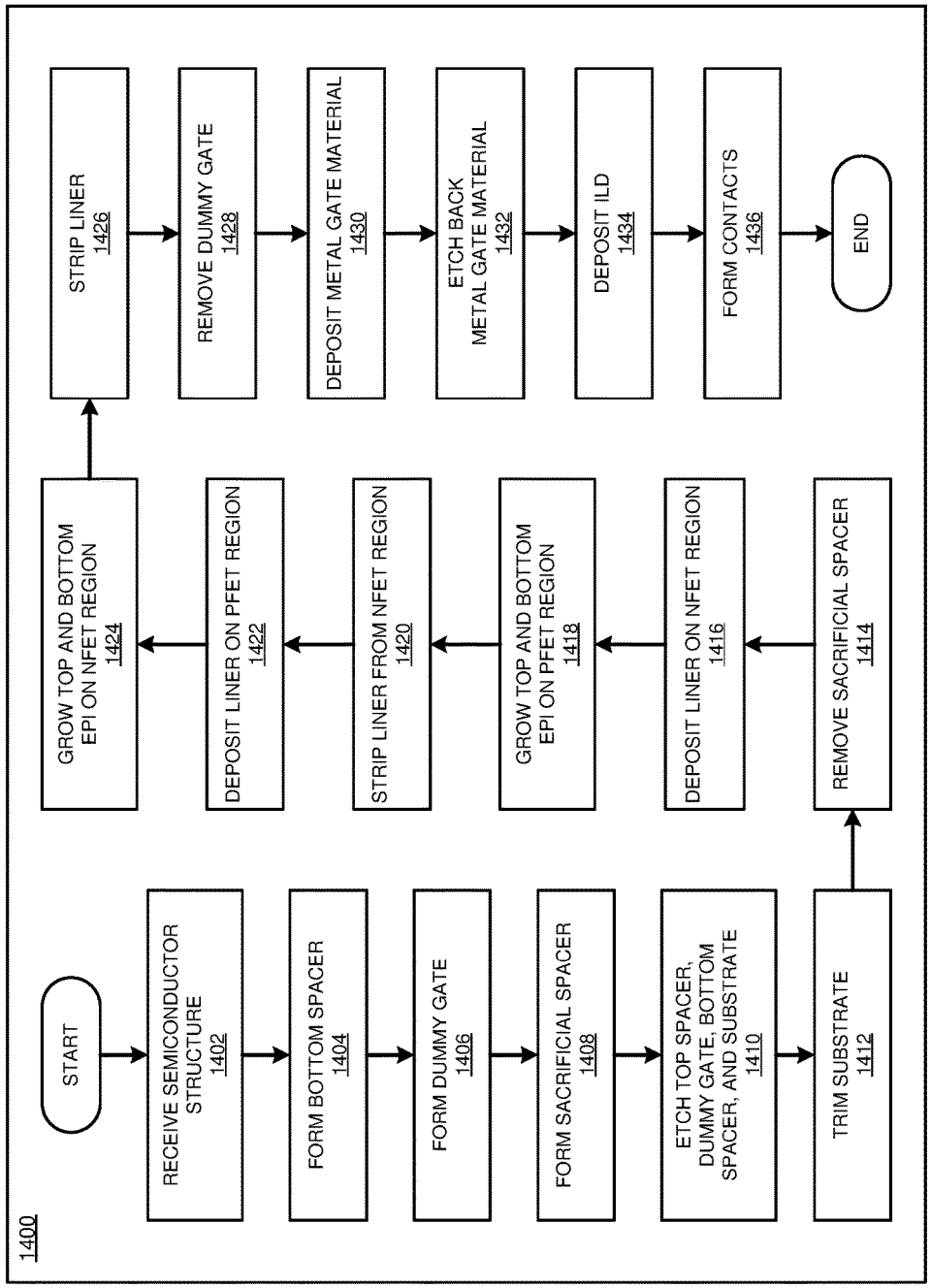
FIG. 14 depicts a flowchart of an example process for fabrication of a VFET according to an illustrative embodiment.

With reference to FIG. 14, this figure depicts a flowchart of an example process 1400 for fabrication of a VFET according to an illustrative embodiment. In block 1402, the fabrication system receives a semiconductor structure 100 including substrate 102 having two vertical fins 104, first hardmask 106 disposed on each fin 104, and second hardmask 108 disposed on each first hardmask 106 within each of NFET region 128 and PFET region 130. In block 1404, the fabrication system forms bottom spacer 110 upon an upper surface of substrate 102. In block 1406, the fabrication system forms dummy gate 112 upon bottom spacer 110. In block 1408, the fabrication system forms top spacer 114 upon dummy gate 112.

In block 1408, the fabrication system forms sacrificial spacers 116 upon a top surface of top spacer 114 and around portions of fins 104 and first hardmasks 106. In block 1410, the fabrication system etches portions of top spacer 114, dummy gate 112, bottom spacer 110, and substrate 102 to form trenches 118 adjacent to fins 104. In one or more embodiments, the fabrication system etches substrate 102 to below the upper surface of substrate 102. In block 1412, the fabrication system trims portions of substrate 102 within trench 118 to form lateral recesses 120 under bottom spacer 110. In a particular embodiment, the fabrication system trims portions of substrate 102 using a lateral etching process such as a non-isotropic etching process.

In block 1414, the fabrication system removes sacrificial spacers 116. In block 1416, the fabrication system deposits first liner 122 upon substrate 102, fins 104, first hardmask 106, second hardmask 108, bottom spacer 110, dummy gate 112, top spacer 114, and lateral recesses 120 of NFET region 128.

In block 1418, the fabrication system further deposits an epitaxial growth material upon PFET region 130 to simultaneously grow first bottom source and drain epitaxy 124 upon substrate 102 within lateral recesses 120 and adjacent to fins 104, and first top source and drain epitaxy 126 upon top spacer 114 adjacent to fin 104. In the embodiment, first bottom source and drain epitaxy 124 and first top source and drain epitaxy 126 are an nFET epitaxial growth. In the embodiment, first liner 122 prevents growth of the epitaxy material upon portions of NFET region 128. In the embodiment, first bottom source and drain epitaxy 124 grows on the surface of substrate 102 at a faster rate than the first top source and drain epitaxy 126 due to the different material composition of substrate 102 and first top spacer 114. As a result, the volume of epitaxy material grown to form first bottom source and drain epitaxy 124 is greater than that to form first top source and drain epitaxy 126.

In block 1420, the fabrication system strips or otherwise removes first liner 122 from NFET region 128. In block 1422, the fabrication system deposits second liner 122 upon substrate 102, fins 104, first hardmask 106, second hardmask 108, bottom spacer 110, dummy gate 112, top spacer 114, first source and drain bottom epitaxy 124, and first source and drain top epitaxy 126 of PFET region 130. In block 1424, the fabrication system further deposits an epitaxial growth material upon NFET region 130 to simultaneously grow a second bottom source and drain epitaxy 134 upon substrate 102 within lateral recesses 120 and adjacent to fins 104, and a second top source and drain epitaxy 136 upon top spacer 114 adjacent to fin 104. In the embodiment, second bottom source and drain epitaxy 134 and second top source and drain epitaxy 136 are a pFET epitaxial growth. In the embodiment, second liner 132 prevents growth of the epitaxy material upon portions of PFET region 130. In the embodiment, second bottom source and drain epitaxy 134 grows on the surface of substrate 102 at a faster rate than the second top source and drain epitaxy 136 due to the different material composition of substrate 102 and first top spacer 114. As a result, the volume of epitaxy material grown to form second bottom source and drain epitaxy 124 is greater than that to form second top source and drain epitaxy 126.

In block 1426, the fabrication system strips or otherwise removes second liner 132 from PFET region 130. In block 1428, the fabrication system removes dummy gate from NFET region 128 and PFET region 130. In block 1430, the fabrication system deposits metal gate material 138 upon NFET region 128 and PFET region 130. In a particular embodiment, metal gate material 138 includes a high dielectric constant (high K) metal gate (HKMG) material.

In block 1432, the fabrication system etches back metal gate material 138 within NFET region 128 and PFET region 130 to substantially remove metal gate material 138 except for portions of metal gate material 138 disposed between bottom spacer 110 and top spacer 114. In particular embodiments, the fabrication system etches metal gate material 138 using a selective etching process such that the material of bottom spacer 110, top spacer 114, first bottom source and drain epitaxy 124, first top source and drain epitaxy 126, second bottom source and drain epitaxy 134, and second top source and drain epitaxy 136 is not affected by the etching process.

In block 1434, the fabrication system deposits ILD material 140 upon NFET region 128 and PFET region 130. In block 1436, the fabrication system further forms source and drain contacts (CA) 142 within ILD material 140 in contact with fin 104 and first top source and drain epitaxy 126 in NFET region 128, and fin 104 and second top source and drain epitaxy 136 in PFET region 130. In an embodiment the fabrication system may further form gate contacts (CB) and trench contacts (TS) within ILD material 140. Process 1400 then ends. As a result of the process of FIG. 14, a VFET is fabricated in accordance with an embodiment.

Figure 15:
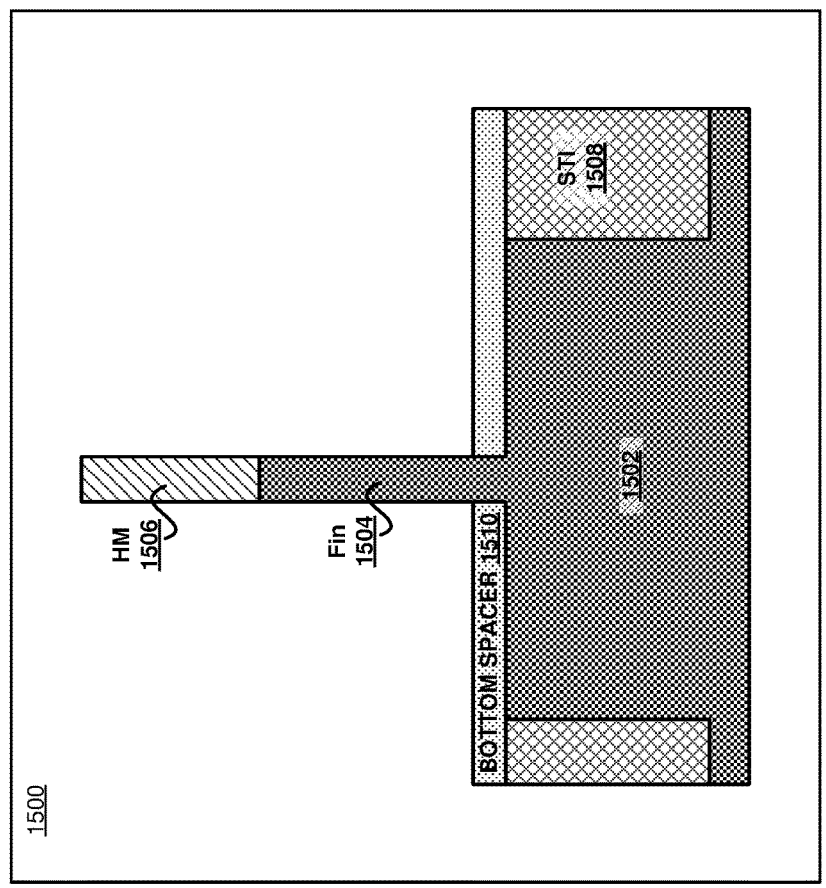
FIG. 15 depicts a portion of another process for fabricating a VFET according to an illustrative embodiment.

With reference to FIG. 15, this figure depicts a portion of another process for fabricating a VFET according to an illustrative embodiment. In the illustrative embodiment, a semiconductor structure 1500 including a substrate 1502 having a vertical fin 1504, and a hardmask 1506 disposed on fin 1504 is received. Structure 1500 further includes a shallow trench isolation (STI) layer 1508 disposed upon substrate 1502. In the embodiment, a fabrication system forms a bottom spacer 1510 upon an upper surface of substrate 1502 and STI layer 1508 and in contact with a bottom portion of fin 1504. In particular embodiments, substrate 1502 and hardmask 1506 are formed of a Si material. In a particular embodiment, bottom spacer 1510 is formed of a silicon carbide doped oxide (SiCO).

Figure 16:
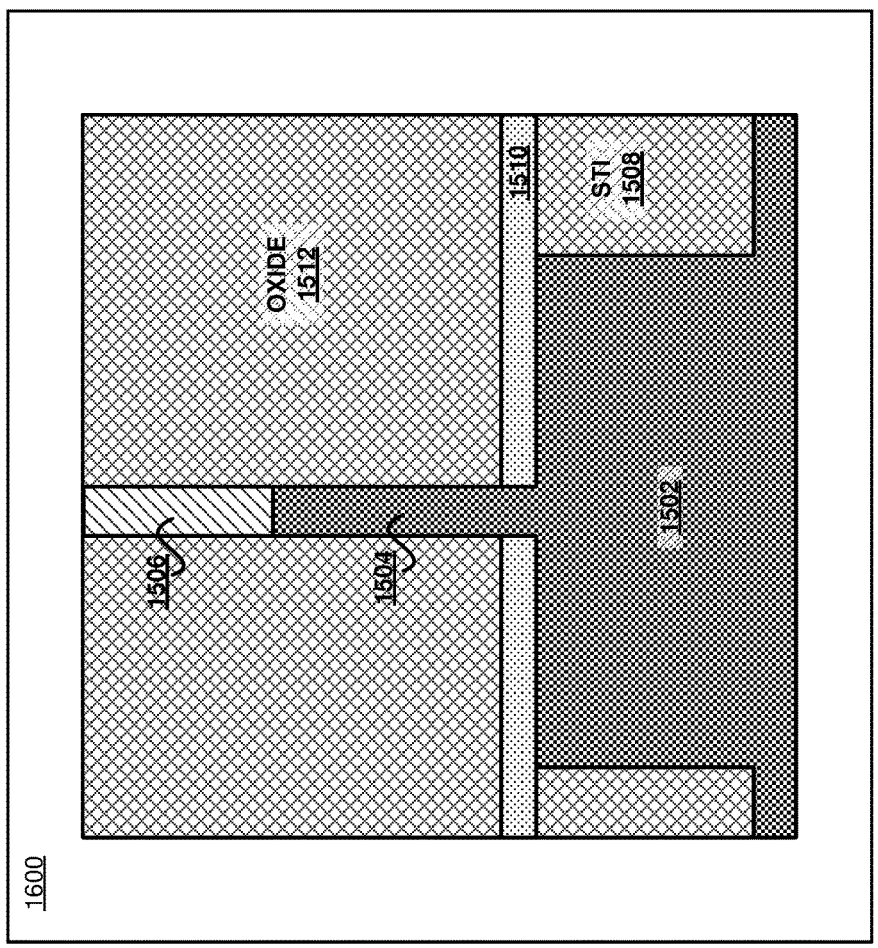
FIG. 16 depicts another portion of the process in which a structure 1600 is formed.

With reference to FIG. 16, this figure depicts another portion of the process in which a structure 1600 is formed. In the embodiment, the fabrication system deposits an oxide fill 1512 upon a top surface of bottom spacer 1510 and around vertical sides of fin 1504 and hardmask 1506. In a particular embodiment, oxide fill 1512 is formed of a silicon dioxide ($SiO_2$) material. In the embodiment, the fabrication system further performs a chemical mechanical planarization (CMP) process to planarize the surface of structure 1600.

Figure 17:
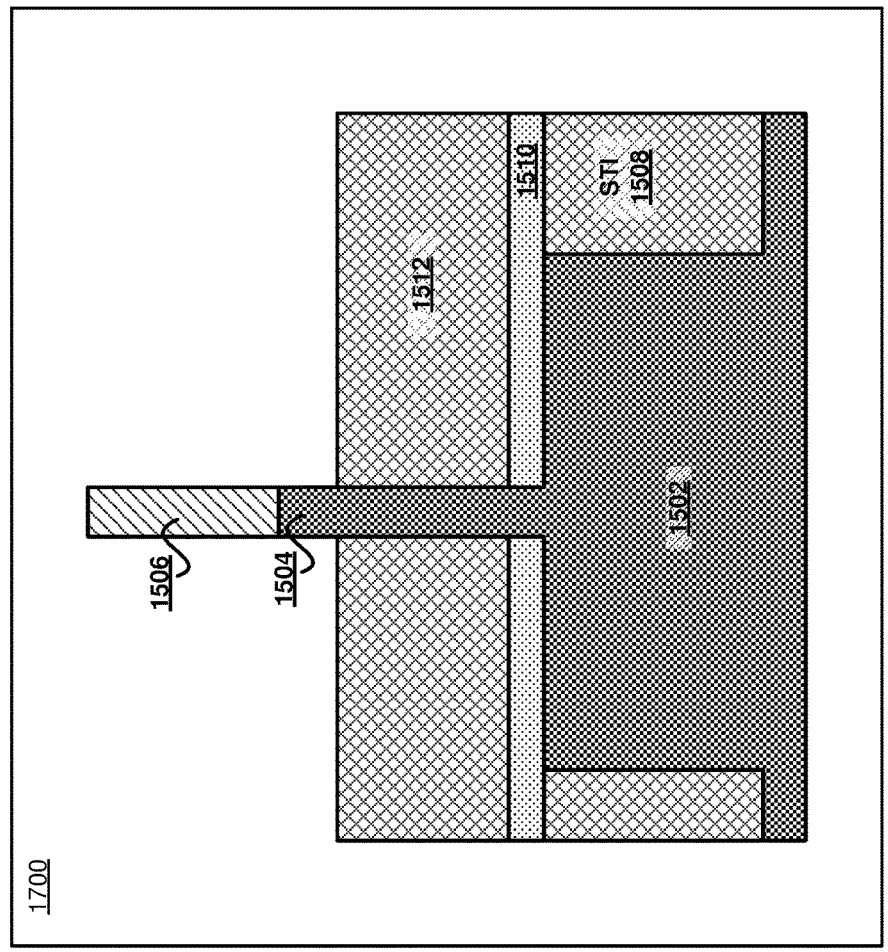
FIG. 17 depicts another portion of the process in which a structure 1700 is formed.

With reference to FIG. 17, this figure depicts another portion of the process in which a structure 1700 is formed. In the embodiment, the fabrication system recesses oxide fill 1512 below hardmask 1506 to expose a portion of fin 1504.

Figure 18:
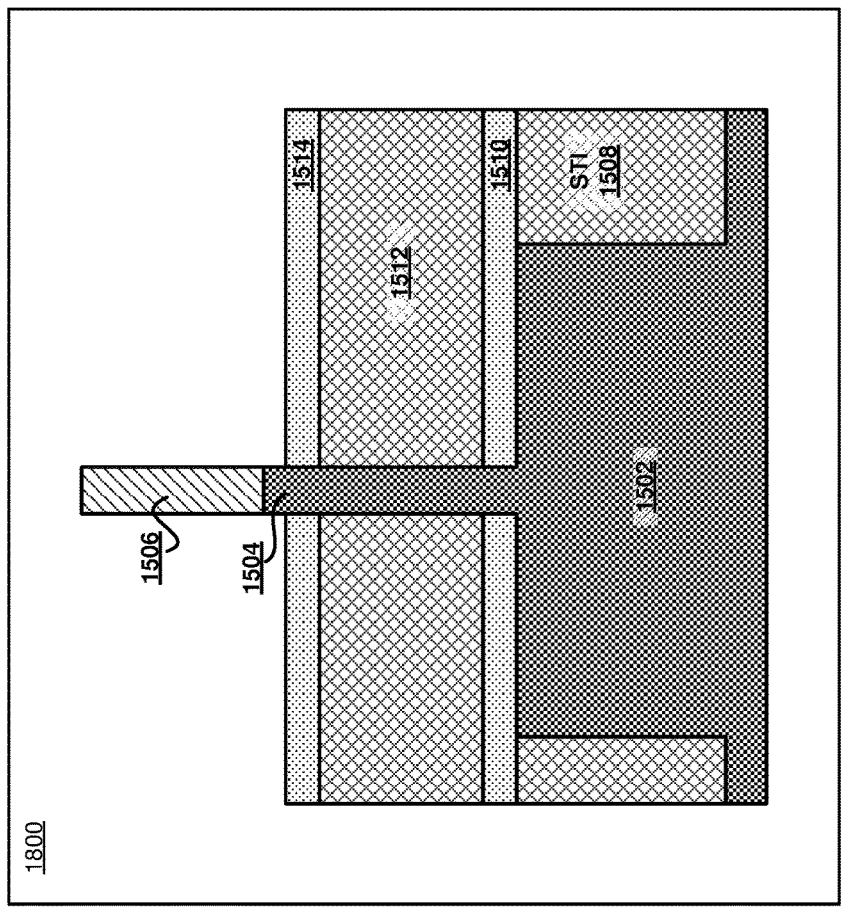
FIG. 18 depicts another portion of the process in which a structure 1800 is formed.

With reference to FIG. 18, this figure depicts another portion of the process in which a structure 1800 is formed. In the embodiment, the fabrication system deposits a top spacer 1514 upon oxide fill 1512 and in contact with a top portion of fin 1504. In a particular embodiment, top spacer 1514 is formed of a SiCO material.

Figure 19:
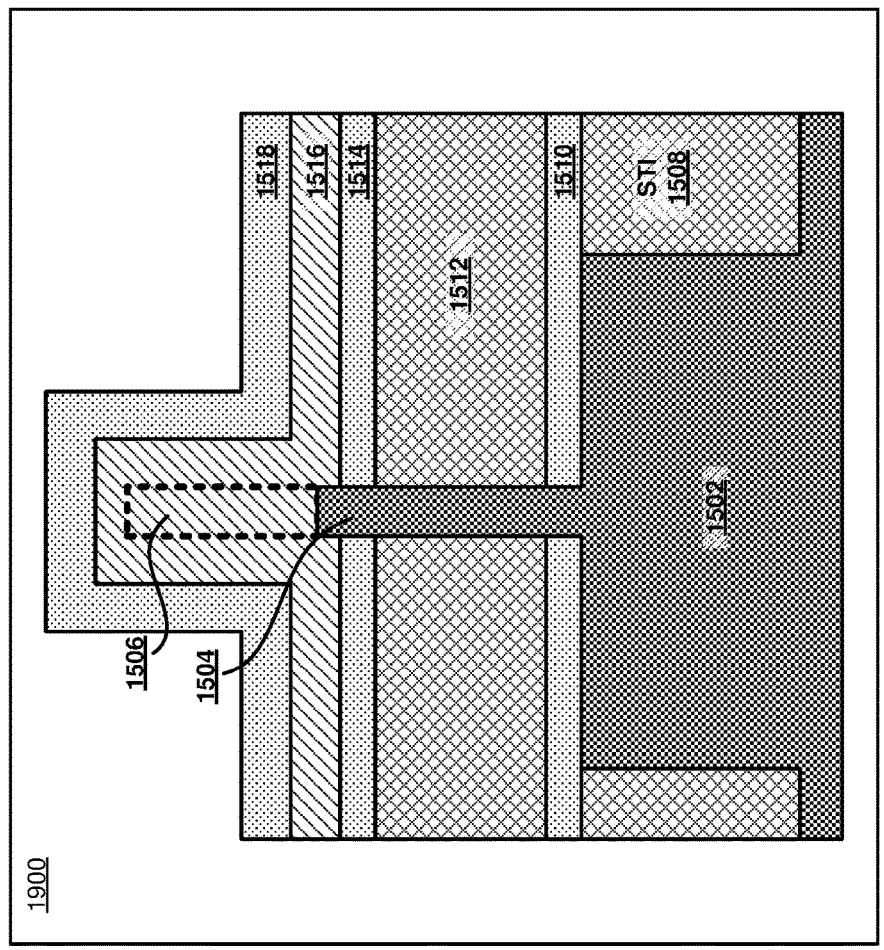
FIG. 19 depicts another portion of the process in which a structure 1900 is formed.

With reference to FIG. 19, this figure depicts another portion of the process in which a structure 1900 is formed. In the embodiment, the fabrication system deposits a first liner 1516 upon top spacer 1514, the exposed portion of fin 1506, and hard mask 1506. In a particular embodiment, first liner 1516 is formed of a SiN material. In the embodiment, the fabrication system further deposits a second liner 1518 upon first liner 1516. In a particular embodiment, second liner 1518 is formed of a SiCO material. In particular embodiments, first liner 1516 and second liner 1518 are deposited using an ALD deposition process.

Figure 20:
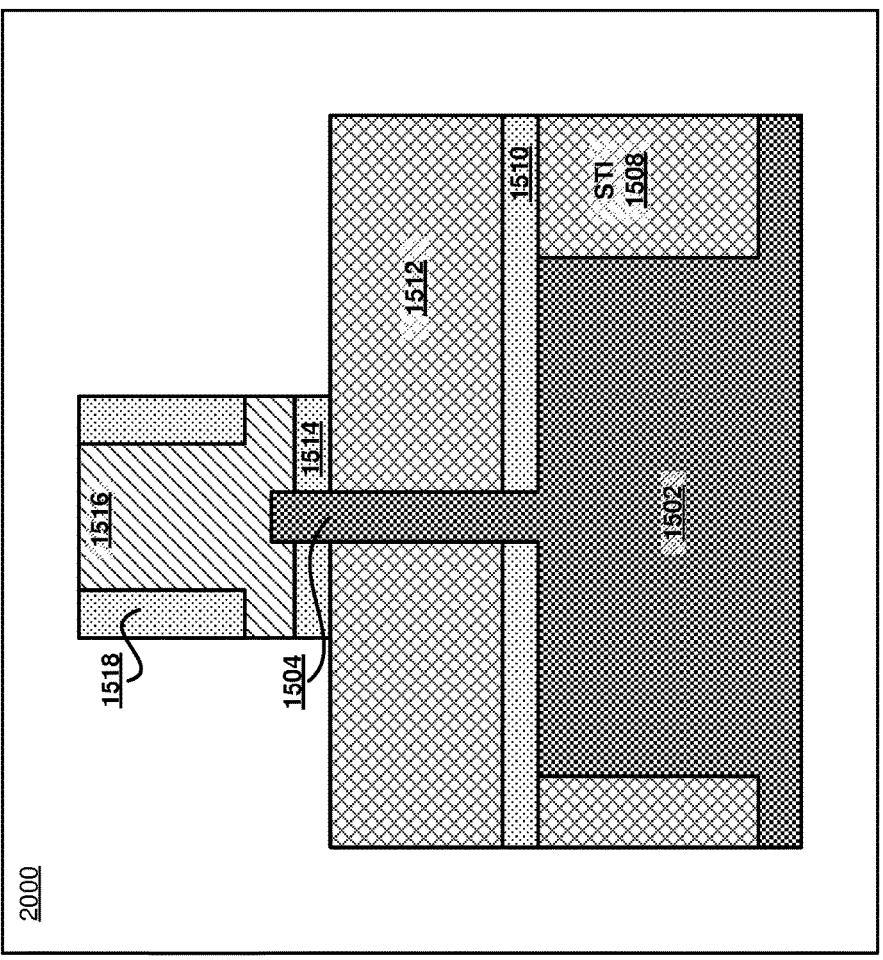
FIG. 20 depicts another portion of the process in which a structure 2000 is formed.

With reference to FIG. 20, this figure depicts another portion of the process in which a structure 2000 is formed. In the embodiment, the fabrication system etches back first liner 1516, second liner 1518, and top spacer 1514 to remove first liner 1516, second liner 1518, and top spacer 1514 from portions of oxide fill 1512 and remove second liner 1518 from a top surface of hard mask 1506. In the embodiment, portions of top spacer 1514 remain between oxide fill 1512 and first liner 1516, and portions of second liner 1518 remain on top of and at vertical sides of first liner 1516.

Figure 21:
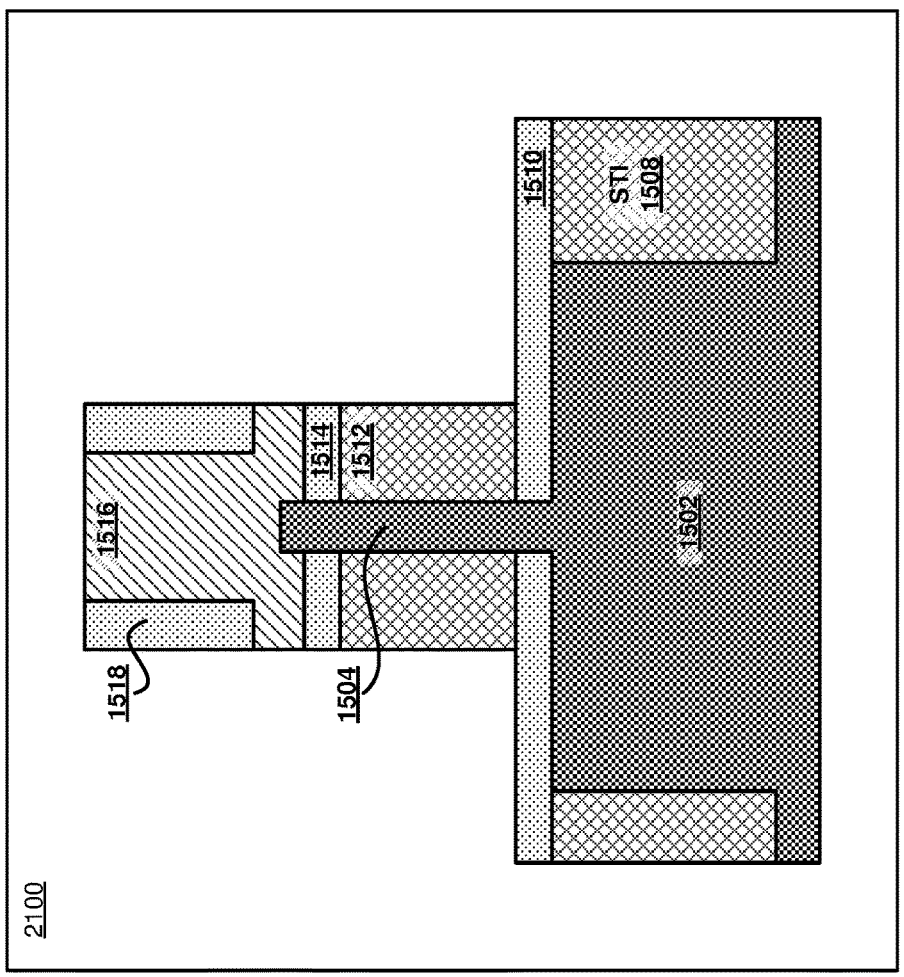
FIG. 21 depicts another portion of the process in which a structure 2100 is formed.

With reference to FIG. 21, this figure depicts another portion of the process in which a structure 2100 is formed. In the embodiment, the fabrication system etches portions of oxide fill 1512 to remove portions of oxide fill 1512 disposed upon portions of bottom spacer 1510. In the embodiment, portions of oxide fill 1512 disposed between bottom spacer 1510 and top spacer 1514 remain.

Figure 22:
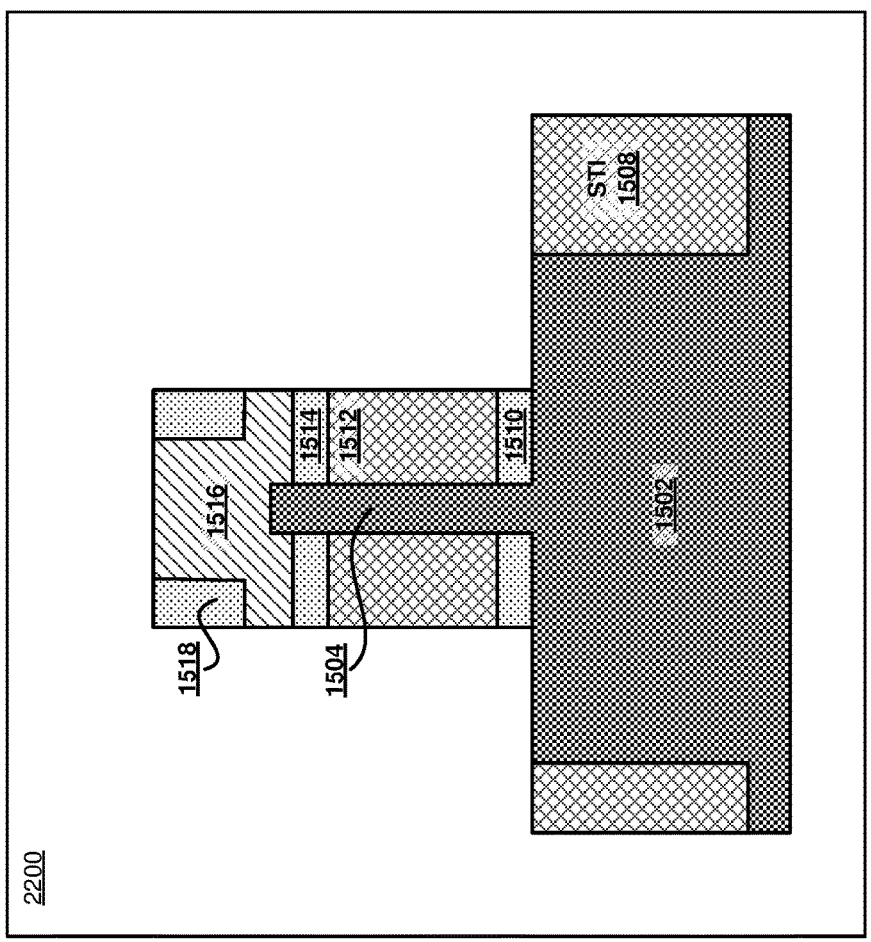
FIG. 22 depicts another portion of the process in which a structure 2200 is formed.

With reference to FIG. 22, this figure depicts another portion of the process in which a structure 2200 is formed. In the embodiment, the fabrication system etches portions of bottom spacer 1510 to remove the portions from substrate 1502 and STI layer 1508. In the embodiment, the portions of bottom spacer 1510 disposed between substrate 1502 and oxide fill 1512 remain.

Figure 23:
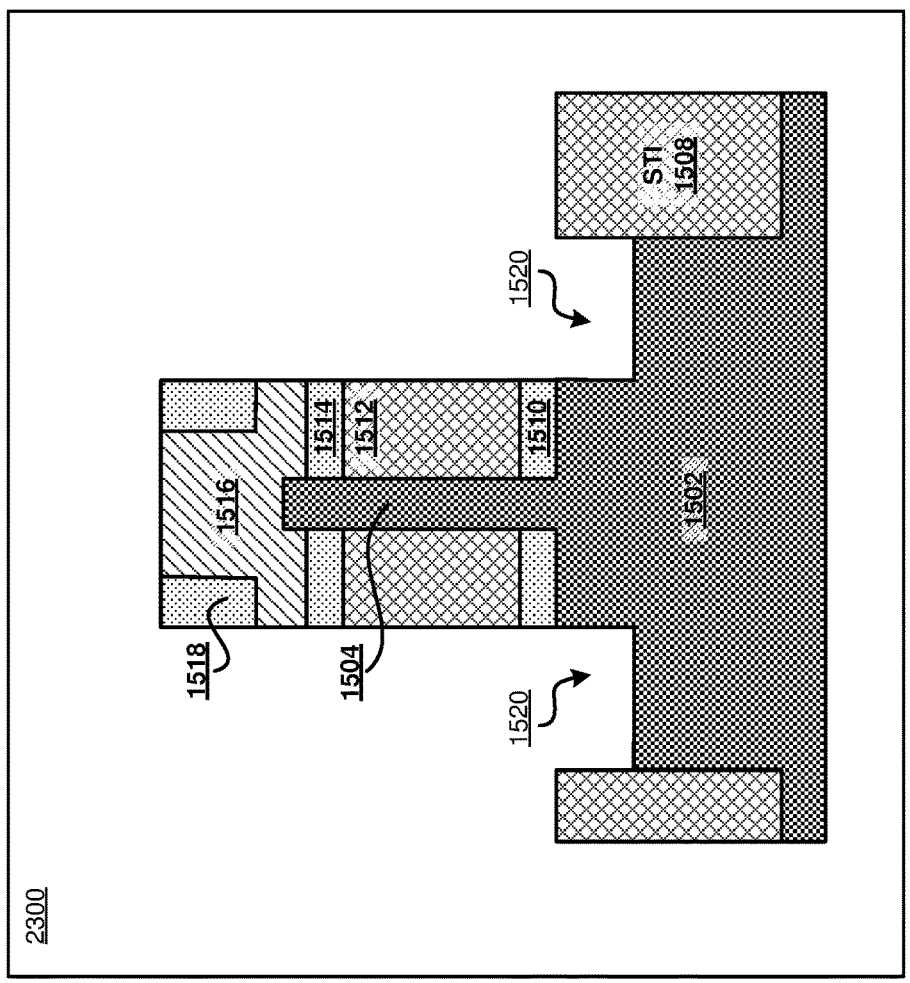
FIG. 23 depicts another portion of the process in which a structure 2300 is formed.

With reference to FIG. 23, this figure depicts another portion of the process in which a structure 2300 is formed. In the embodiment, the fabrication system selectively recesses portions of substrate 1502 to form recesses 1520. In a particular embodiment, the fabrication system recesses portions of substrate 1502 using an etching process that is selective to the material of substrate 1502 while not affecting the material of STI layer 1508.

Figure 24:
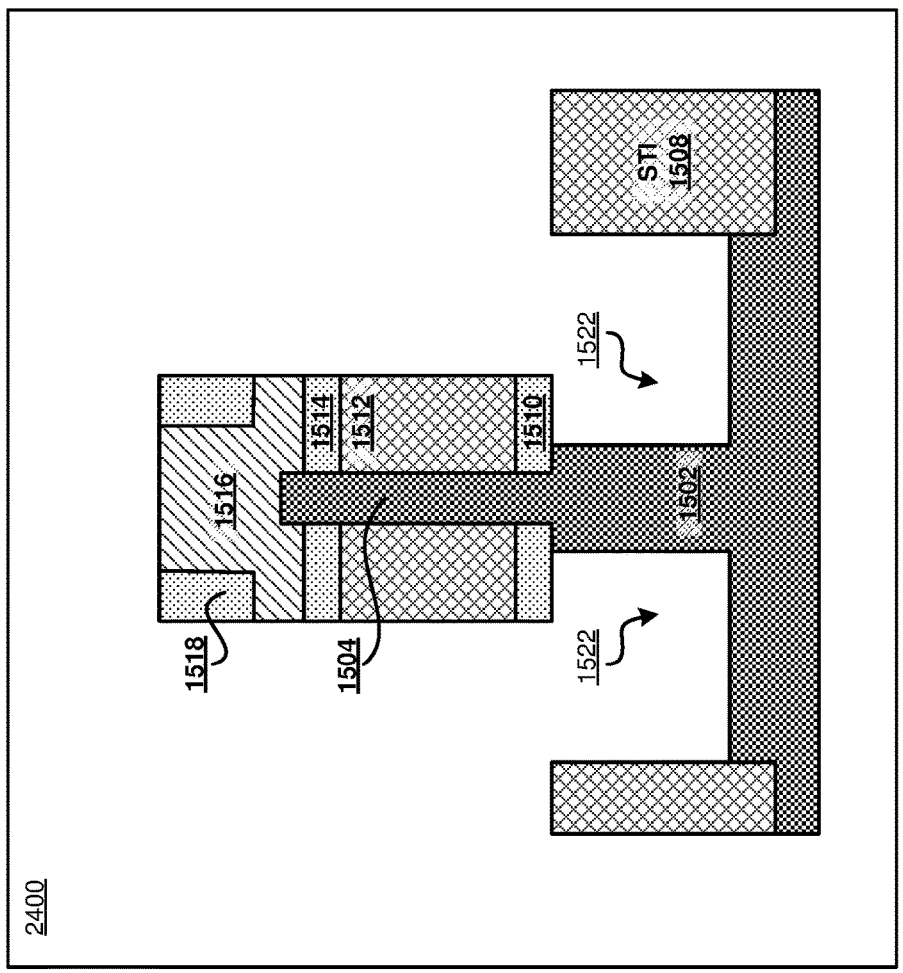
FIG. 24 depicts another portion of the process in which a structure 2400 is formed.

With reference to FIG. 24, this figure depicts another portion of the process in which a structure 2400 is formed. In the embodiment, the fabrication system selectively trims substrate 1502 to form lateral recesses 1522 under bottom spacer 1510. In a particular embodiment, the fabrication system trims portions of substrate 1502 using a lateral etching process such as a non-isotropic etching process.

Figure 25:
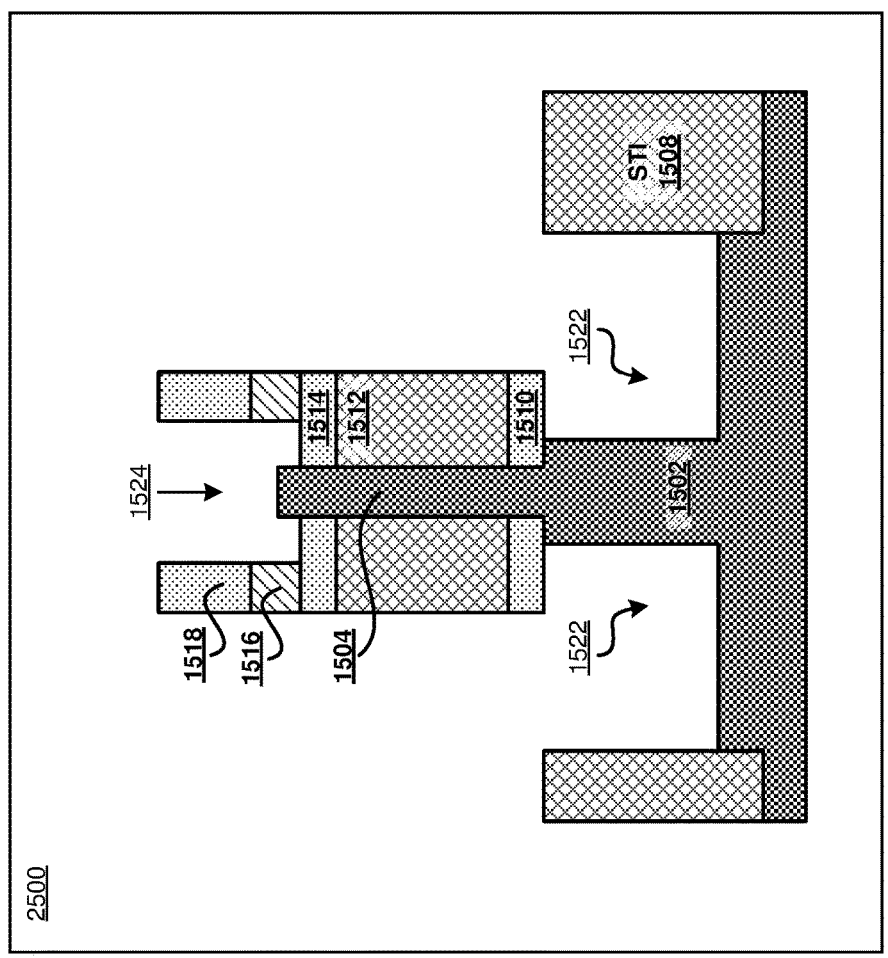
FIG. 25 depicts another portion of the process in which a structure 2500 is formed.

With reference to FIG. 25, this figure depicts another portion of the process in which a structure 2500 is formed. In the embodiment, the fabrication system selectively etches portions of first liner 1516 to form top recess 1524 around a top portion of fin 1504. In a particular embodiment, the selective etching process is a selective nitride open to SiCO material to form top recess 1524.

Figure 26:
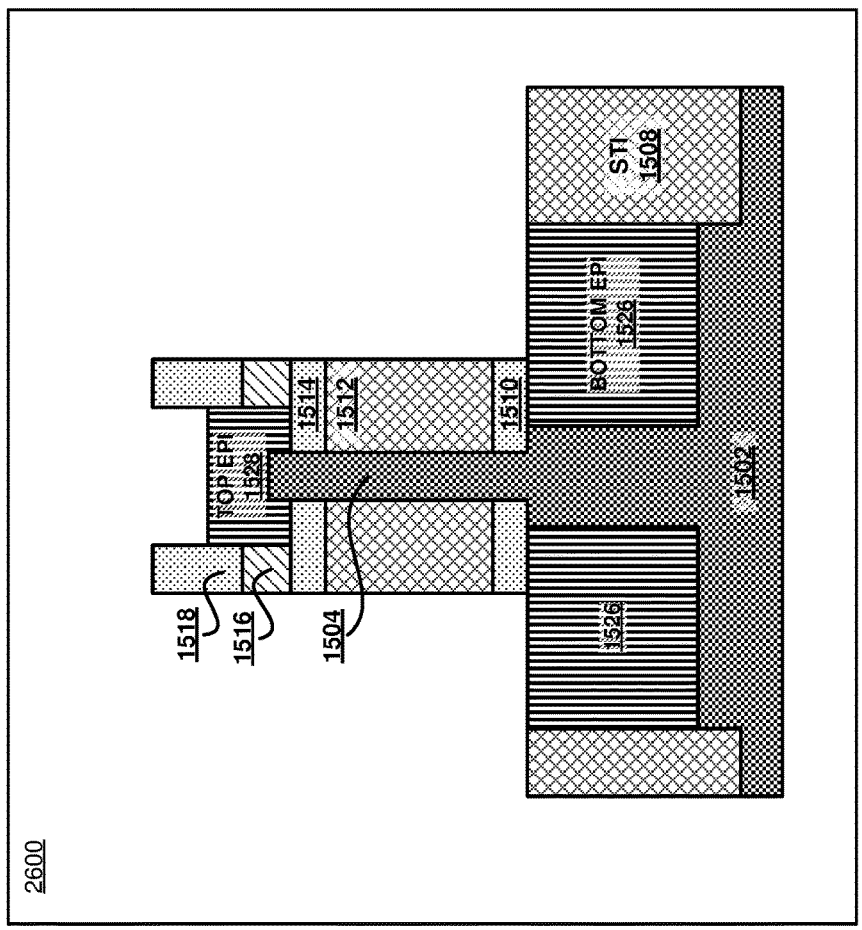
FIG. 26 depicts another portion of the process in which a structure 2600 is formed.

With reference to FIG. 26, this figure depicts another portion of the process in which a structure 2600 is formed. In the embodiment, the fabrication system deposits an epitaxial growth material to simultaneously grow a first bottom source and drain epitaxy 1526 upon substrate 102 within lateral recesses 1522 and adjacent to fins 1504, and a first top source and drain epitaxy 1528 within top recess 1524 upon top spacer 1514 and fin 1504. In a particular embodiment, bottom source and drain epitaxy 1526 grows on the surface of substrate 1502 at a faster rate than the top source and drain epitaxy 1528 due to the different material composition of substrate 1502 and top spacer 1514. As a result, the volume of epitaxy material grown to form bottom source and drain epitaxy 1526 is greater than that to form top source and drain epitaxy 1528.

Figure 27:
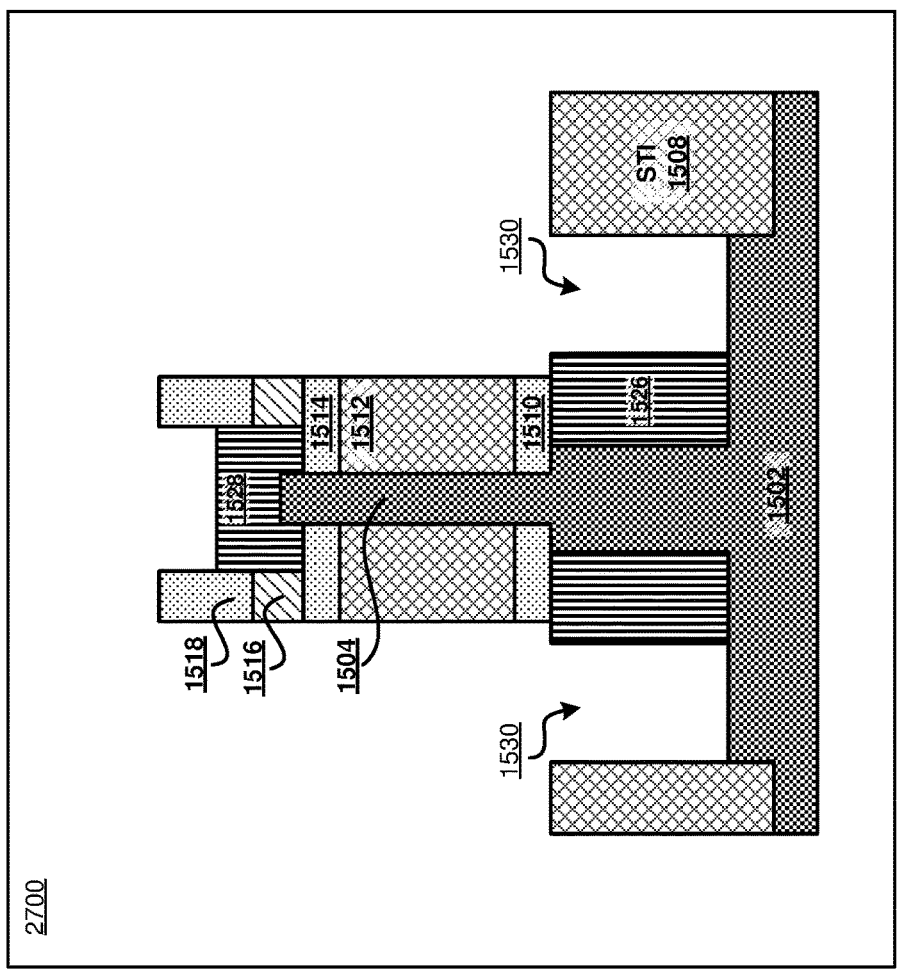
FIG. 27 depicts another portion of the process in which a structure 2700 is formed.

With reference to FIG. 27, this figure depicts another portion of the process in which a structure 2700 is formed. In the embodiment, the fabrication system etches portions of bottom source and drain epitaxy 1526 to form recesses 1530 between bottom source and drain epitaxy 1526 and STI layer 1508.

Figure 28:
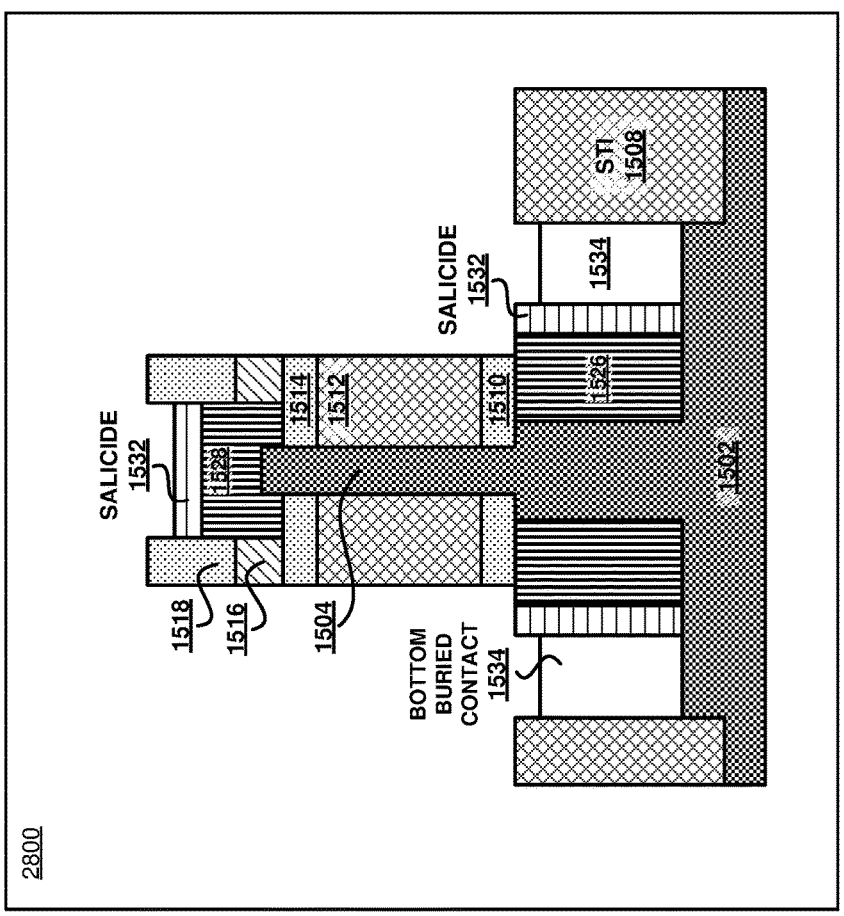
FIG. 28 depicts another portion of the process in which a structure 2800 is formed.

With reference to FIG. 28, this figure depicts another portion of the process in which a structure 2800 is formed. In the embodiment, the fabrication system optionally forms a salicide layer 1532 upon a top surface of top source and drain epitaxy 1528 and adjacent to bottom source and drain epitaxy 1526. In a particular embodiment, salicide layer 1522 is a self-aligned silicide formed by a reaction of thin metal film with silicon. The fabrication system further forms bottom buried contacts 1534 between STI layer 1508 and silicide layer 1532.

Figure 29:
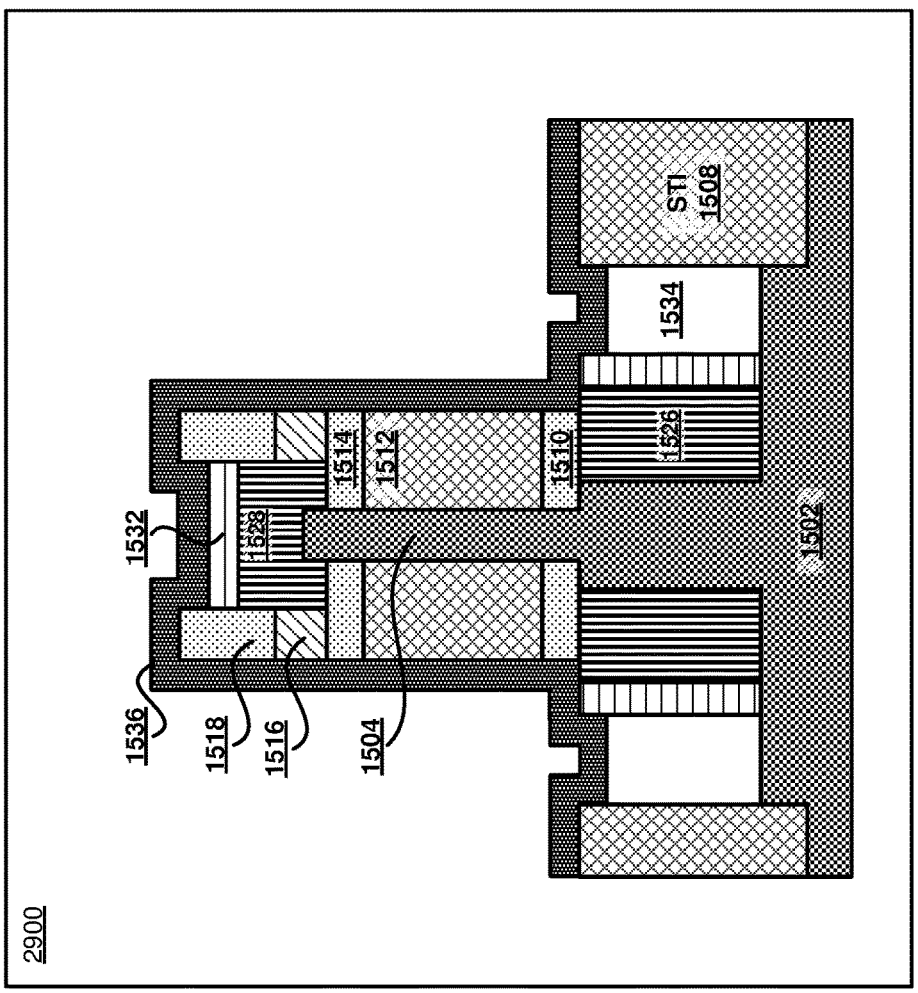
FIG. 29 depicts another portion of the process in which a structure 2900 is formed.

With reference to FIG. 29, this figure depicts another portion of the process in which a structure 2900 is formed. In the embodiment, the fabrication system deposits a third liner 1536 upon exposed portions of STI layer 1508, bottom buried contacts 1534, salicide layer 1522, bottom spacer 1510, oxide fill 1512, top spacer 1514, first liner 1516, and second liner 1518. In a particular embodiment, third liner 1536 is formed of a SiN material. In one or more embodiments, the fabrication system deposits third liner 1536 using an ALD deposition process.

Figure 30:
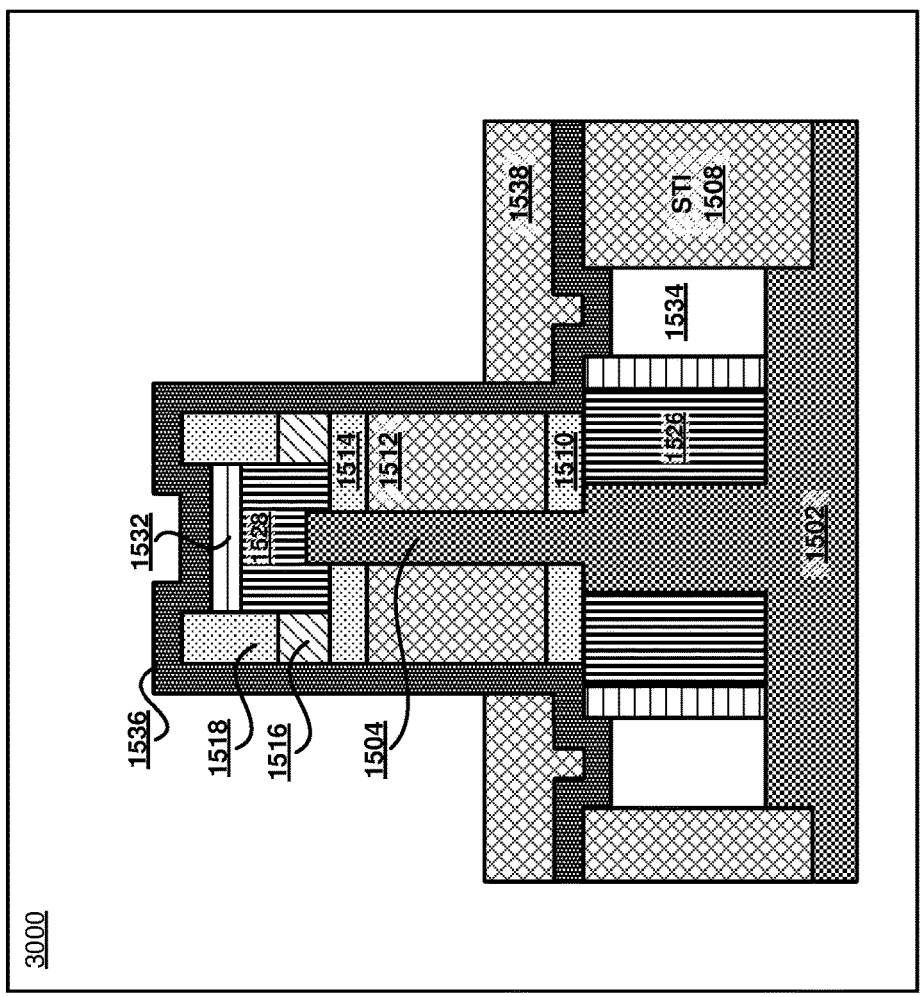
FIG. 30 depicts another portion of the process in which a structure 3000 is formed.

With reference to FIG. 30, this figure depicts another portion of the process in which a structure 3000 is formed. In the embodiment, the fabrication system deposits a oxide layer 1538 upon portions of third liner 1536. In particular embodiments, the oxide layer 1538 is formed of an oxide material and deposited using a high density plasma (HDP) deposition process.

Figure 31:
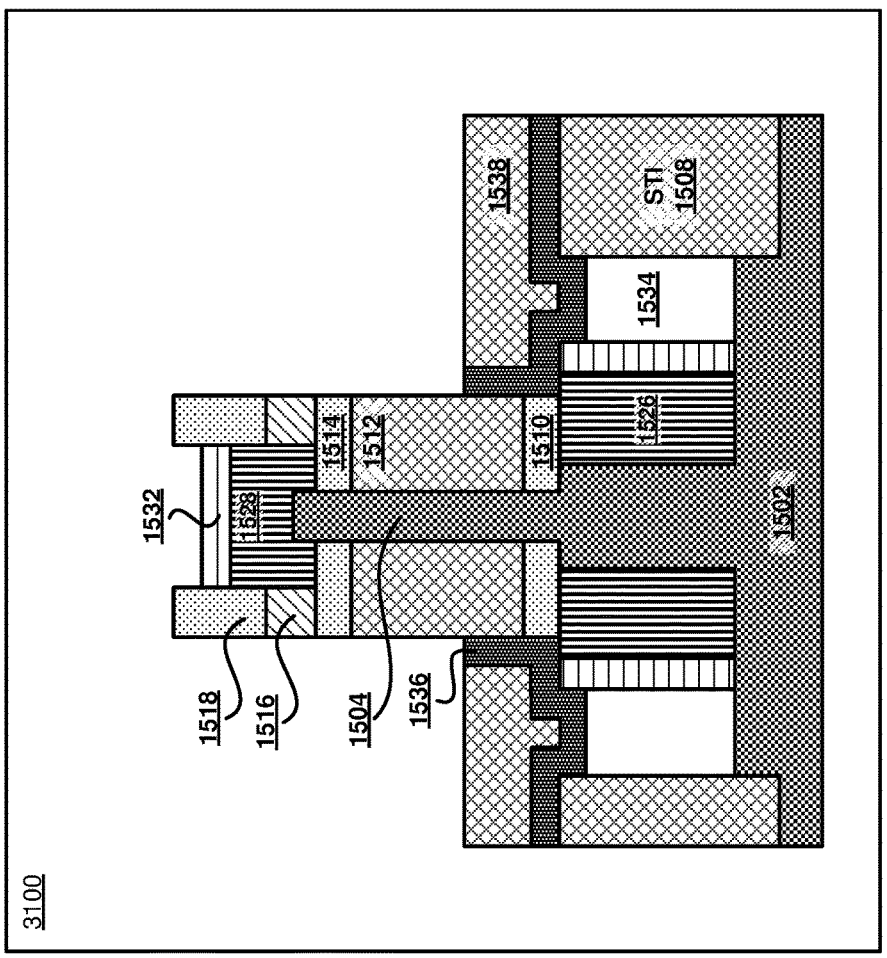
FIG. 31 depicts another portion of the process in which a structure 3100 is formed.

With reference to FIG. 31, this figure depicts another portion of the process in which a structure 3100 is formed. In the embodiment, the fabrication system etches back exposed portions of third liner 1536 to remove third liner 1536 except for portions of third liner 1536 disposed between oxide layer 1538 and STI layer 1508, bottom spacer 1510, oxide fill 1512, bottom source and drain epitaxy 1526, salicide layer 1532, and bottom buried contacts 1534. In a particular embodiment, the fabrication system etches third liner 1536 using an SiN isotropic etch process.

Figure 32:
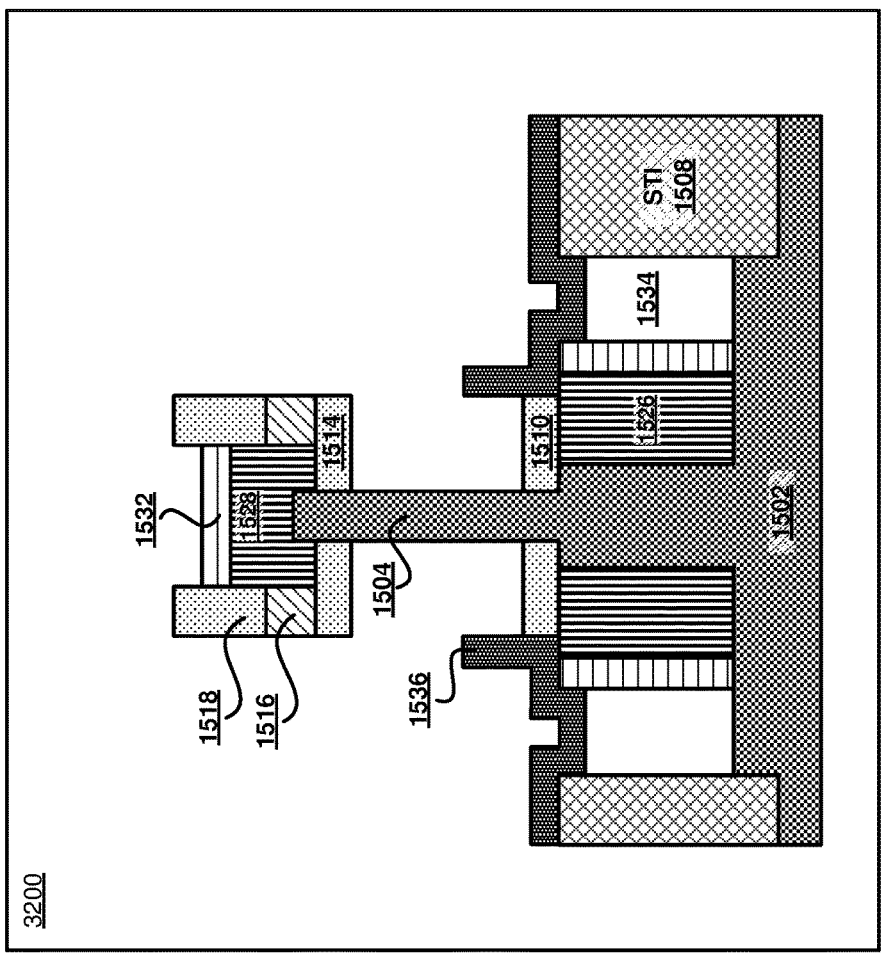
FIG. 32 depicts another portion of the process in which a structure 3200 is formed.

With reference to FIG. 32, this figure depicts another portion of the process in which a structure 3200 is formed. In the embodiment, the fabrication system removes oxide fill 1512 and oxide layer 1538 from structure 3100 of FIG. 31. In a particular embodiment, the fabrication system removes oxide fill 1512 and oxide layer 1538 using a selective oxide etching process.

Figure 33:
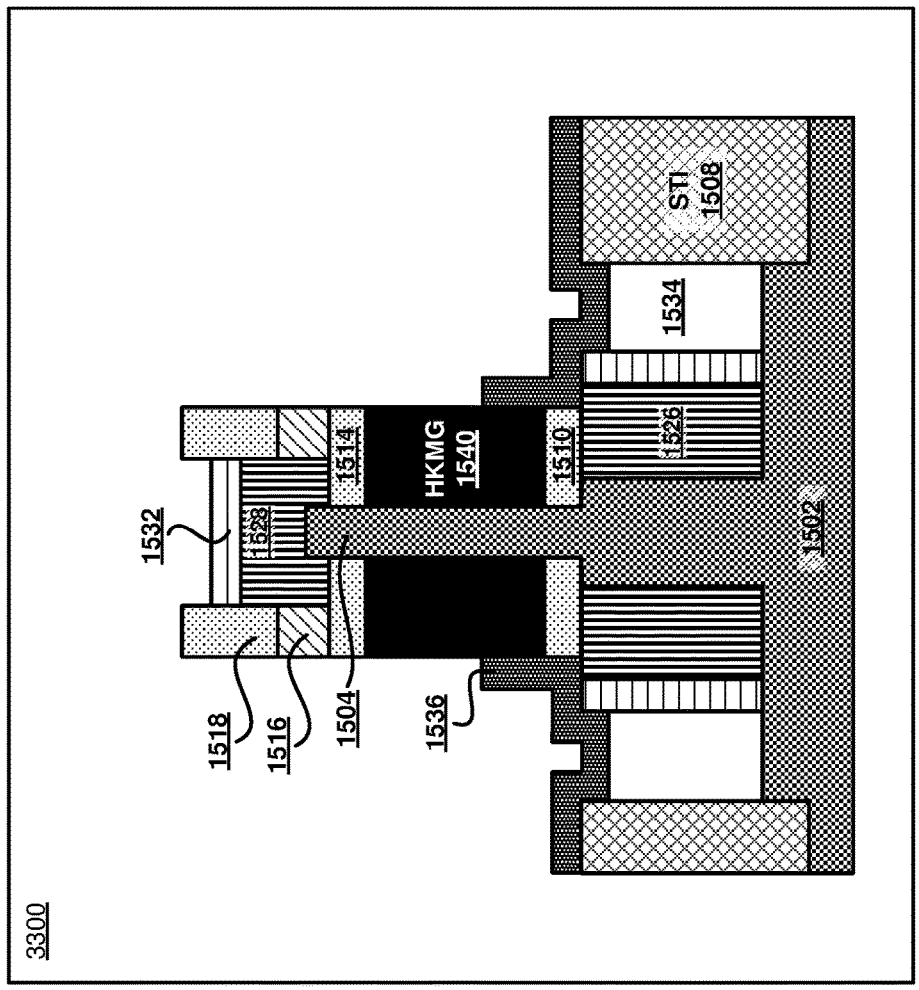
FIG. 33 depicts another portion of the process in which a structure 3300 is formed.

With reference to FIG. 33, this figure depicts another portion of the process in which a structure 3300 is formed. In the embodiment, the fabrication system deposits metal gate material 1540 between bottom spacer 1510 and top spacer 1514 to form a replacement metal gate. In a particular embodiment, metal gate material 1540 includes an HKMG material. In a particular embodiment, the fabrication system deposits metal gate material 1540 using an ALD deposition process and an anisotropic etching process.

Figure 34:
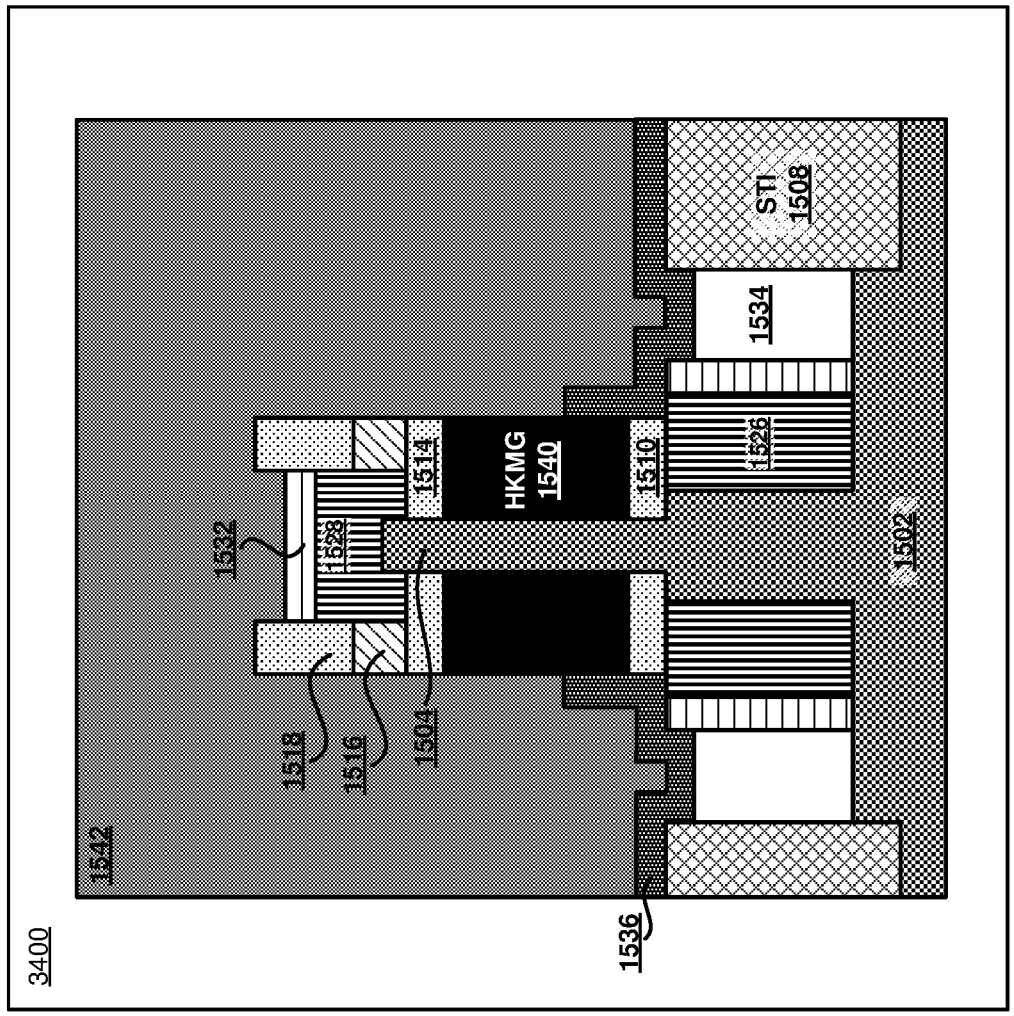
FIG. 34 depicts another portion of the process in which a structure 3400 is formed.

With reference to FIG. 34, this figure depicts another portion of the process in which a structure 3400 is formed. In the embodiment, the fabrication system deposits an ILD material 1542 upon structure 3200 of FIG. 32.

Figure 35:
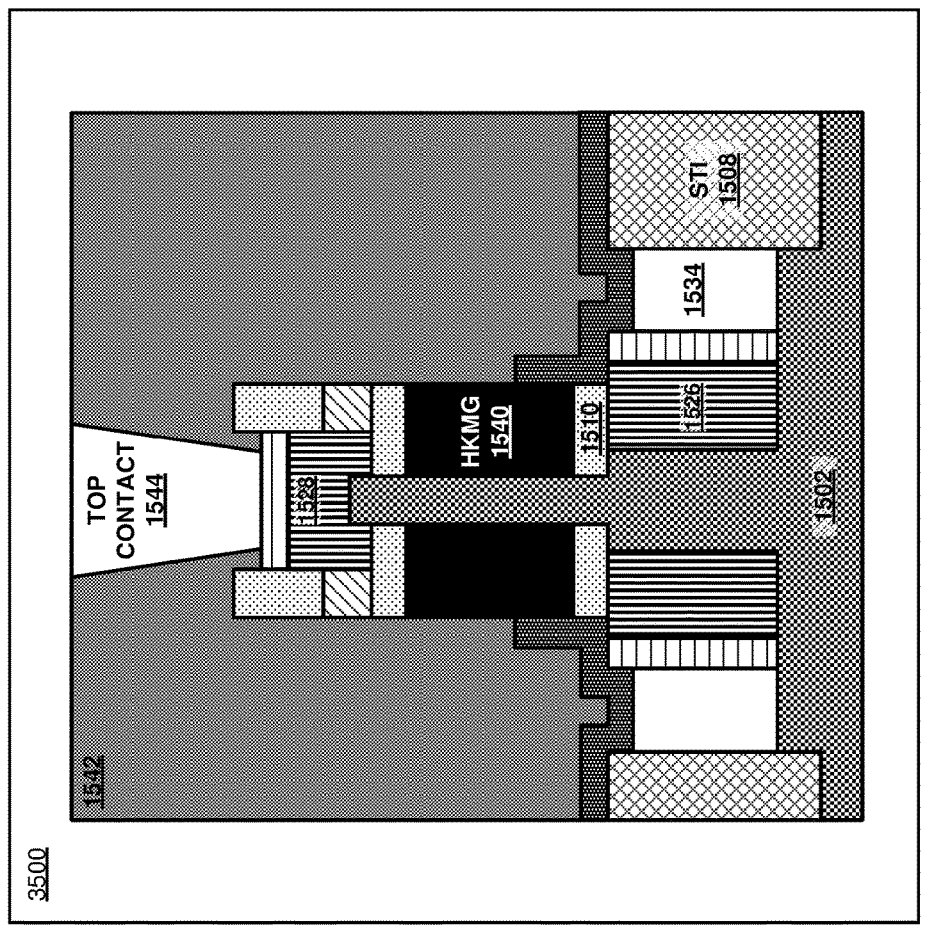
FIG. 35 depicts another portion of the process in which a structure 3500 is formed.

With reference to FIG. 35, this figure depicts another portion of the process in which a structure 3500 is formed. In the embodiment, the fabrication system forms a top source and drain contact 1544 through ILD material 1542 in contact with silicide layer 1532 and/or top source and drain epitaxy 1528. Although not shown in FIG. 35, in an embodiment the fabrication system may further form gate contacts (CB) and trench contacts (TS) within ILD material 1544. As a result of the process of FIG. 35, a VFET is fabricated in accordance with an embodiment.

Figure 36:
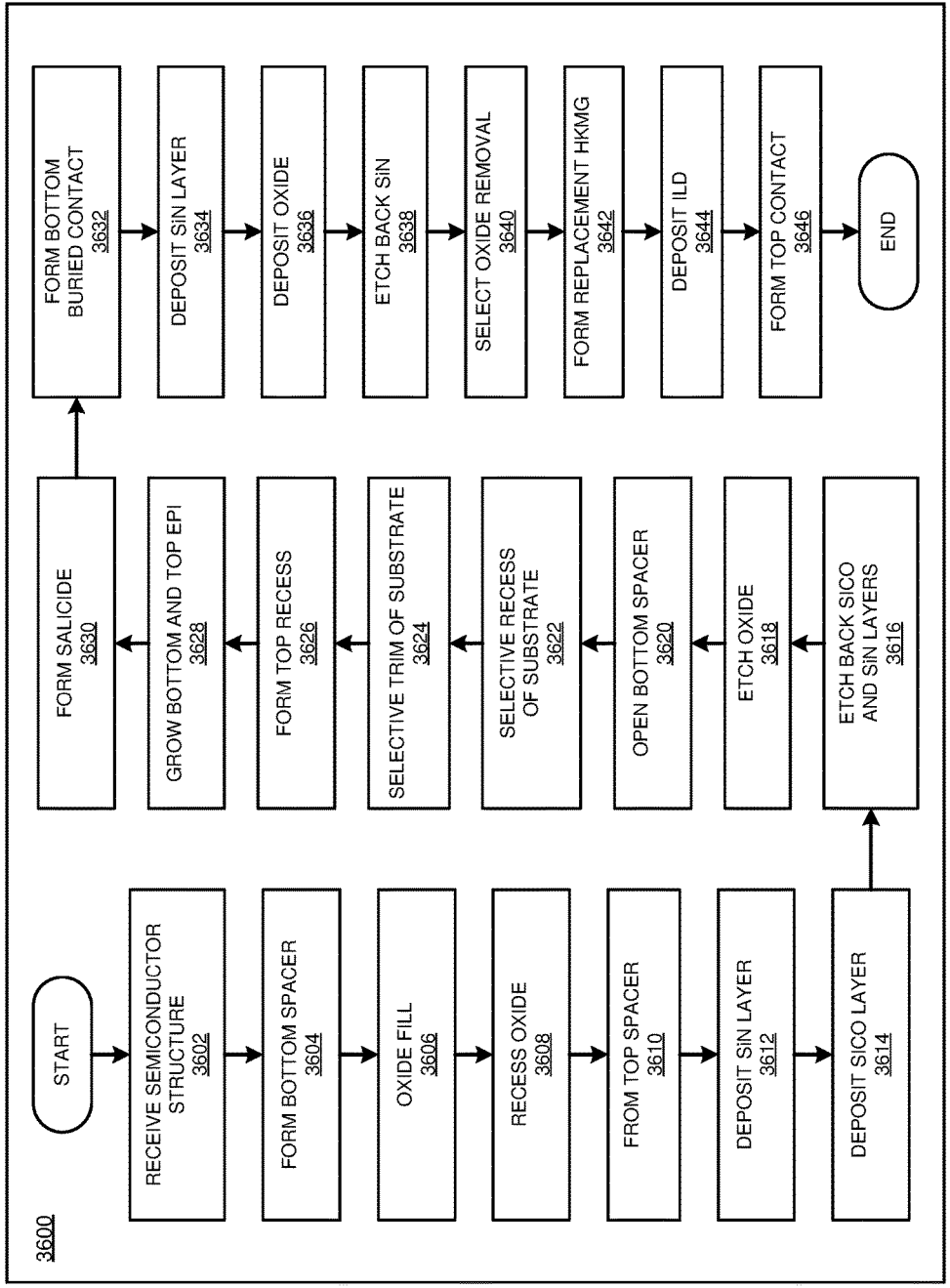
FIG. 36 depicts a flowchart of another example process for fabrication of a VFET according to an illustrative embodiment.

With reference to FIG. 36, this figure depicts a flowchart of another example process 3600 for fabrication of a VFET according to an illustrative embodiment. In block 3602, semiconductor structure 1500 including substrate 1502 having vertical fin 1504, and hardmask 1506 disposed on fin 1504 is received. Structure 1500 further includes shallow trench isolation (STI) layer 1508 disposed upon substrate 1502. In block 3604, the fabrication system forms bottom spacer 150 upon a top surface of substrate 1502 and STI layer 1508.

In block 3606, the fabrication system deposits oxide fill 1512 upon a top surface of bottom spacer 1510 and around vertical sides of fin 1504 and hardmask 1506. In an embodiment, the fabrication system further performs a chemical mechanical planarization (CMP) process to planarize the surface of the semiconductor structure. In block 3608, the fabrication system recesses oxide fill 1512 below hardmask 1506 to expose a portion of fin 1504.

In block 3610, the fabrication system forms top spacer 1514 upon oxide fill 1512 by a deposition process. In block 3612, the fabrication system deposits first liner 1516 upon top spacer 1514, the exposed portion of fin 1506, and hard mask 1506. In a particular embodiment, first liner 1516 is formed of a SiN material. In block 3614, the fabrication system deposits second liner 1518 upon first liner 1516. In a particular embodiment, second liner 1518 is formed of a SiCO material. In particular embodiments, first liner 1516 and second liner 1518 are deposited using an ALD deposition process.

In block 3616, the fabrication system etches back first liner 1516, second liner 1518, and top spacer 1514 to remove first liner 1516, second liner 1518, and top spacer 1514 from portions of oxide fill 1512 and remove second liner 1518 from a top surface of hard mask 1506. In the embodiment, portions of top spacer 1514 remain between oxide fill 1512 and first liner 1516, and portions of second liner 1518 remain on top of and at vertical sides of first liner 1516.

In block 3618, the fabrication system etches portions of oxide fill 1512 to remove portions of oxide fill 1512 disposed upon portions of bottom spacer 1510. In the embodiment, portions of oxide fill 1512 disposed between bottom spacer 1510 and top spacer 1514 remain. In block 3620, the fabrication system opens portions of bottom spacer 1510 by an etching process to remove the portions from substrate 1502 and STI layer 1508. In the embodiment, the portions of bottom spacer 1510 disposed between substrate 1502 and oxide fill 1512 remain. In block 3622, the fabrication system selectively recesses portions of substrate 1502 to form recesses 1520. In a particular embodiment, the fabrication system recesses portions of substrate 1502 using an etching process that is selective to the material of substrate 1502 while not affecting the material of STI layer 1508.

In block 3624, the fabrication system selectively trims substrate 1502 to form lateral recesses 1522 under bottom spacer 1510. In a particular embodiment, the fabrication system trims portions of substrate 1502 using a lateral etching process such as a non-isotropic etching process. In block 3626, the fabrication system selectively etches portions of first liner 1516 to form top recess 1524 around the top portion of fin 1504.

In block 3628, the fabrication system deposits an epitaxial growth material to simultaneously grow a first bottom source and drain epitaxy 1526 upon substrate 102 within lateral recesses 1522 and adjacent to fins 1504, and a first top source and drain epitaxy 1528 within top recess 1524 upon top spacer 1514 and fin 1504. In a particular embodiment, bottom source and drain epitaxy 1526 grows on the surface of substrate 1502 at a faster rate than the top source and drain epitaxy 1528 due to the different material composition of substrate 1502 and top spacer 1514. As a result, the volume of epitaxy material grown to form bottom source and drain epitaxy 1526 is greater than that to form top source and drain epitaxy 1528.

In block 3630, the fabrication system etches portions of bottom source and drain epitaxy 1526 to form recesses 1530 between bottom source and drain epitaxy 1526 and STI layer 1508 and forms salicide layer 1532 upon a top surface of top source and drain epitaxy 1528 and adjacent to bottom source and drain epitaxy 1526. In block 3632, the fabrication system further forms bottom buried contacts 1534 between STI layer 1508 and silicide layer 1532. In block 3634, the fabrication system deposits a third liner 1536 upon exposed portions of STI layer 1508, bottom buried contacts 1534, salicide layer 1522, bottom spacer 1510, oxide fill 1512, top spacer 1514, first liner 1516, and second liner 1518. In a particular embodiment, third liner 1536 is formed of a SiN material. In one or more embodiments, the fabrication system deposits third liner 1536 using an ALD deposition process.

In block 3636, the fabrication system deposits a oxide layer 1538 upon portions of third liner 1536. In particular embodiments, the oxide layer 1538 is formed of an oxide material and deposited using a high density plasma (HDP) deposition process. In block 3638, the fabrication system etches back exposed portions of third liner 1536 to remove third liner 1536 except for portions of third liner 1536 disposed between oxide layer 1538 and STI layer 1508, bottom spacer 1510, oxide fill 1512, bottom source and drain epitaxy 1526, salicide layer 1532, and bottom buried contacts 1534. In a particular embodiment, the fabrication system etches third liner 1536 using an SiN isotropic etch process.

In block 3640, the fabrication system removes oxide fill 1512 and oxide layer 1538 from the semiconductor structure. In a particular embodiment, the fabrication system removes oxide fill 1512 and oxide layer 1538 using a selective oxide etching process. In block 3642, forms a replacement gate between bottom spacer 1510 and top spacer 1514 by depositing metal gate material 1540 between bottom spacer 1510 and top spacer 1514. In a particular embodiment, metal gate material 1540 includes an HKMG material. In a particular embodiment, the fabrication system deposits metal gate material 1540 using an ALD deposition process and an anisotropic etching process.

In block 3644, the fabrication system deposits an ILD material 1542 upon the semiconductor structure. In block 3646, the fabrication system forms a top source and drain contact 1544 through ILD material 1542 in contact with silicide layer 1532 and/or top source and drain epitaxy 1528. In an embodiment the fabrication system may further form gate contacts (CB) and trench contacts (TS) within ILD material 1544. Process 3600 then ends. As a result of the process of FIG. 36, a VFET is fabricated in accordance with an embodiment.

Thus, a computer implemented method, system or apparatus, and computer program product are provided in the illustrative embodiments for fabricating vertical transistors and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

The present invention may be a system, a method, an apparatus, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for fabricating a semiconductor device comprising:
   receiving a semiconductor structure including a substrate, the substrate structure further including a fin formed on a portion of the substrate, and a first hard mask disposed on a top surface of the fin;
   forming a bottom spacer on the substrate, the bottom spacer being in contact with a bottom portion of the fin;
   forming a top spacer in contact with a top portion of the fin;
   forming a lateral recess in the substrate under the bottom spacer; and
   simultaneously growing a first epitaxy upon the bottom spacer within the lateral recess and a second epitaxy upon the top spacer, the first epitaxy forming a bottom source and drain and the second epitaxy forming a top source and drain.

2. The method of claim 1, further comprising:
   forming a dummy gate upon the bottom spacer, the dummy gate disposed between the bottom spacer and the top spacer.

3. The method of claim 2, further comprising:
   forming a sacrificial spacer upon the top spacer and around a portion of the fin; and
   etching portions of the top spacer, the dummy gate, the bottom spacer, and the substrate to form a trench adjacent to the fin.

4. The method of claim 3, wherein forming the lateral recess includes removing portions of the substrate within the trench under the bottom spacer.

5. The method of claim 4, further comprising removing the sacrificial spacer.

6. The method of claim 3, wherein the lateral recess is formed by a lateral etching process.

7. The method of claim 2, further comprising:
   removing the dummy gate; and
   forming a metal gate between the bottom spacer and the top spacer.

8. The method of claim 7, wherein forming the metal gate further includes:
   depositing a metal gate material; and
   etching the metal gate material such that the metal gate material remains between the bottom spacer and the top spacer.

9. The method of claim 8, wherein the metal gate material includes a high dielectric constant (high-K) metal gate material.

10. The method of claim 1, further comprising:
    depositing an interlayer dielectric material upon the semiconductor structure; and
    forming a contact within the interlayer dielectric material in contact with the top source and drain.

11. The method of claim 1, further comprising:
    depositing an oxide fill upon the bottom spacer, the oxide fill disposed between the bottom spacer and the top spacer.

12. The method of claim 11, further comprising:
    depositing a liner upon the top spacer around the top portion of the fin; and
    forming a top recess within the liner around the top portion of the fin, the second epitaxy growing within the top recess.

13. The method of claim 11, further comprising:
    removing the oxide fill; and
    forming a forming a metal gate between the bottom spacer and the top spacer.

14. An apparatus comprising:
    a semiconductor structure including a substrate, the substrate structure further including a fin formed on a portion of the substrate, and a first hard mask disposed on a top surface of the fin;
    a bottom spacer formed on the substrate, the bottom spacer being in contact with a bottom portion of the fin;
    a top spacer formed in contact with a top portion of the fin;
    a lateral recess formed in the substrate under the bottom spacer; and
    a first epitaxy upon the bottom spacer within the lateral recess and a second epitaxy upon the top spacer, the first epitaxy forming a bottom source and drain and the second epitaxy forming a top source and drain, wherein the first epitaxy and the second epitaxy are grown simultaneously.

15. The apparatus of claim 14, further comprising:
    a trench formed adjacent to the fin through portions of the top spacer, the bottom spacer, and the substrate.

16. The apparatus of claim 14, further comprising:
    a metal gate between the bottom spacer and the top spacer.

17. The apparatus of claim 14, further comprising:
an interlayer dielectric material deposited upon the semiconductor structure; and
a contact formed within the interlayer dielectric material in contact with the top source and drain.

18. A computer usable program product comprising one or more computer-readable storage devices, and program instructions stored on at least one of the one or more storage devices, the stored program instructions comprising:
program instructions to receive a semiconductor structure including a substrate, the substrate structure further including a fin formed on a portion of the substrate, and a first hard mask disposed on a top surface of the fin;
program instructions to form a bottom spacer on the substrate, the bottom spacer being in contact with a bottom portion of the fin;
program instructions to form a top spacer in contact with a top portion of the fin;
program instructions to form a lateral recess in the substrate under the bottom spacer; and
program instructions to simultaneously grow a first epitaxy upon the bottom spacer within the lateral recess and a second epitaxy upon the top spacer, the first epitaxy forming a bottom source and drain and the second epitaxy forming a top source and drain.

19. The computer usable program product of claim 18, wherein the computer usable code is stored in a computer readable storage device in a data processing system, and wherein the computer usable code is transferred over a network from a remote data processing system.

20. The computer usable program product of claim 18, wherein the computer usable code is stored in a computer readable storage device in a server data processing system, and wherein the computer usable code is downloaded over a network to a remote data processing system for use in a computer readable storage device associated with the remote data processing system.

* * * * *